(12) United States Patent
Rich et al.

(10) Patent No.: US 9,581,651 B2
(45) Date of Patent: *Feb. 28, 2017

(54) DIAGNOSTIC USE OF PHYSICAL AND ELECTRICAL BATTERY PARAMETERS AND STORING RELATIVE CONDITION DATA

(71) Applicant: BlackBerry Limited, Waterloo (CA)

(72) Inventors: David Gerard Rich, Waterloo (CA); Taha Shabbir Husain Sutarwala, Burlington (CA); Surajit Sengupta, Cambridge (CA)

(73) Assignee: BlackBerry Limited, Waterloo, Ontario (CA)

( * ) Notice: Subject to any disclaimer, the term of this patent is extended or adjusted under 35 U.S.C. 154(b) by 200 days.

This patent is subject to a terminal disclaimer.

(21) Appl. No.: 14/486,574

(22) Filed: Sep. 15, 2014

(65) Prior Publication Data
US 2015/0002162 A1    Jan. 1, 2015

Related U.S. Application Data

(63) Continuation of application No. 13/234,191, filed on Sep. 16, 2011, now Pat. No. 8,860,420.

(51) Int. Cl.
*G01N 27/416* (2006.01)
*G01R 31/36* (2006.01)
*H01M 10/48* (2006.01)

(52) U.S. Cl.
CPC ..... *G01R 31/3606* (2013.01); *G01R 31/3679* (2013.01); *H01M 10/48* (2013.01); *Y02E 60/12* (2013.01)

(58) Field of Classification Search
CPC ............................. H01M 10/48; Y02E 60/12
(Continued)

(56) References Cited

U.S. PATENT DOCUMENTS

| 5,565,756 A | 10/1996 | Urbish et al. |
| 5,656,917 A | 8/1997 | Theobald |

(Continued)

FOREIGN PATENT DOCUMENTS

| CA | 2788473 | 9/2012 |
| CA | 2788377 | 3/2013 |

(Continued)

OTHER PUBLICATIONS

European Patent Office, Extended European Search Report issued in European Patent Application No. 11181709.4, dated Mar. 6, 2012, 5 pages.

(Continued)

*Primary Examiner* — M'baye Diao
(74) *Attorney, Agent, or Firm* — Fish & Richardson P.C.

(57) ABSTRACT

In at least one embodiment, a power management module measures an electromagnetic radiation spectrum or a voltage response of a battery module. The measured electromagnetic radiation spectrum or voltage response of the battery is compared to a plurality of reference electromagnetic radiation spectrums or voltage responses, respectively, which may be determined for authentic batteries, for example. A relative condition of the battery, such as an age or state of health, may be estimated based on the measured electromagnetic radiation spectrum or voltage response of the battery module, and stored in a memory store. The rate of change of the relative condition of the battery over a period of time may be determined to identify potential defects in the battery.

20 Claims, 19 Drawing Sheets

(58) Field of Classification Search
USPC .......................................................... 324/433
See application file for complete search history.

(56) References Cited

U.S. PATENT DOCUMENTS

| | | | |
|---|---|---|---|
| 6,002,238 | A | 12/1999 | Champlin |
| 6,160,382 | A | 12/2000 | Yoon et al. |
| 6,285,185 | B1 | 9/2001 | Asjes |
| 6,404,164 | B1 | 6/2002 | Bean et al. |
| 6,545,448 | B1 | 4/2003 | Stanley et al. |
| 6,605,922 | B2 | 8/2003 | Tamai et al. |
| 6,867,595 | B2 | 3/2005 | Chen |
| 7,003,431 | B2 | 2/2006 | Quint et al. |
| 7,058,484 | B1 * | 6/2006 | Potega ..................... G06F 1/26 320/134 |
| 7,206,704 | B2 | 4/2007 | Quint et al. |
| 7,317,995 | B2 | 1/2008 | Quint et al. |
| 7,349,816 | B2 | 3/2008 | Quint et al. |
| 7,375,492 | B2 | 5/2008 | Calhoon et al. |
| 7,375,493 | B2 | 5/2008 | Calhoon et al. |
| 7,541,775 | B2 | 6/2009 | Lee |
| 7,616,002 | B2 | 11/2009 | Quint et al. |
| 7,679,315 | B2 | 3/2010 | Kim et al. |
| 7,743,988 | B2 | 6/2010 | Zemba et al. |
| 7,750,639 | B2 | 7/2010 | Quint et al. |
| 7,751,994 | B2 | 7/2010 | Matsumura et al. |
| 7,915,860 | B2 | 3/2011 | Quint et al. |
| 8,306,764 | B2 * | 11/2012 | Bacon ................ G01R 31/3631 702/63 |
| 8,362,908 | B2 * | 1/2013 | Reams ................. G01R 31/362 324/157 |
| 8,556,795 | B2 * | 10/2013 | Bolyard .............. A61M 1/1086 318/567 |
| 8,564,242 | B2 * | 10/2013 | Hansford ............ H01M 2/1055 320/107 |
| 2001/0052846 | A1 | 12/2001 | Jespersen |
| 2003/0105601 | A1 | 6/2003 | Kobayashi et al. |
| 2005/0001629 | A1 | 1/2005 | Chen |
| 2006/0170397 | A1 | 8/2006 | Srinivasan et al. |
| 2007/0069153 | A1 | 3/2007 | Pai-Paranjape et al. |
| 2007/0072014 | A1 | 3/2007 | Kim et al. |
| 2007/0279002 | A1 | 12/2007 | Partovi |
| 2008/0024137 | A1 | 1/2008 | Carlin et al. |
| 2008/0024268 | A1 | 1/2008 | Wong et al. |
| 2008/0309284 | A1 | 12/2008 | Choksi et al. |
| 2009/0088992 | A1 | 4/2009 | Matsumura et al. |
| 2010/0026236 | A1 | 2/2010 | Kamiyama et al. |
| 2010/0036773 | A1 | 2/2010 | Bennett |
| 2010/0138177 | A1 | 6/2010 | Yu |
| 2010/0171460 | A1 | 7/2010 | Nakajima et al. |
| 2010/0197367 | A1 * | 8/2010 | Pattenden ................. G06F 1/26 455/572 |
| 2010/0244846 | A1 | 9/2010 | Desprez et al. |
| 2011/0001484 | A1 * | 1/2011 | Stits ..................... H01M 10/00 324/426 |
| 2011/0060538 | A1 | 3/2011 | Fahimi et al. |
| 2011/0260556 | A1 * | 10/2011 | Partridge ................ G06F 1/163 307/150 |
| 2013/0069661 | A1 | 3/2013 | Rich et al. |
| 2013/0072154 | A1 | 3/2013 | Rich et al. |

FOREIGN PATENT DOCUMENTS

| | | |
|---|---|---|
| CA | 2788472 | 3/2013 |
| EP | 1087536 | 3/2001 |
| EP | 1087536 | 2/2004 |
| EP | 2224574 | 9/2010 |
| EP | 2571076 | 3/2013 |
| EP | 2571077 | 3/2013 |
| EP | 2571131 | 3/2013 |

OTHER PUBLICATIONS

Response. European Patent Application No. 11181709.4. Dated: Jun. 22, 2012, 19 pages.
Response. European Patent Application No. 11181709.4. Dated: Sep. 3, 2012, 8 pages.
United States Patent and Trademark Office, "Office Action" issued in connection with U.S. Appl. No. 13/234,216, notified Nov. 7, 2013 (13 pages).
European Patent Office, "Extended European Search Report" issued in connection with European Patent Application No. 11181708.6, issued Mar. 6, 2012 (8 pages).
"Response to Extended European Search Report issued on Mar. 6, 2012" in connection with European Patent Application No. 11181708.6, filed Jun. 22, 2012 (30 pages).
Canadian Intellectual Property Office, "Office Action", issued in connection with corresponding Canadian Patent Application No. 2,788,472, dated Jan. 6, 2014 (3 pages).
Canadian Intellectual Property Office, "Office Action", issued in connection with corresponding Canadian Patent Application No. 2,788,377, dated Jan. 2, 2014 (4 pages).
Canadian Intellectual Property Office, "Office Action", issued in connection with corresponding Canadian Patent Application No. 2,788,473, dated Jan. 14, 2014 (4 pages).
European Patent Office, "Decision to Grant" issued in connection with corresponding European Patent Application No. 11181711.0, dated Sep. 26, 2013 (2 pages).
United States Patent and Trademark Office, "Amendment" filed in connection with corresponding U.S. Appl. No. 13/234,216, dated Jan. 30, 2014 (9 pages).
United States Patent and Trademark Office, "Notice of Allowance", issued in connection with corresponding U.S. Appl. No. 13/234,216, dated Feb. 26, 2014 (5 pages).
Office Action. U.S. Appl. No. 13/234,194. Dated: Mar. 20, 2014. (16 pages).
Request for Continued Examination. U.S. Appl. No. 13/234,216. Dated: Apr. 2, 2014. (3 pages).
Amendment. U.S. Appl. No. 13/234,194. Dated: Apr. 14, 2014. (10 pages).
Notice of Allowance. U.S. Appl. No. 13/234,194. Dated: Apr. 24, 2014. (9 pages).
Notice of Allowance. U.S. Appl. No. 13/234,216. Dated: Apr. 30, 2014. (7 pages).
Communication Pursuant to Article 94(3) EPC issued in EP Application No. 11181708.6 on Oct. 23, 2015; 6 pages.
Office Action issued in Canadian Application No. 2,788,472 issued on Jun. 3, 2015; 3 pages.
Communication Pursuant to Article 94(3) issued in EP Application No. 11181709.4 on May 27, 2016; 4 pages.

* cited by examiner

DIAGNOSTIC USE OF PHYSICAL AND ELECTRICAL BATTERY PARAMETERS AND STORING RELATIVE CONDITION DATA

CROSS-REFERENCE TO RELATED APPLICATIONS

This application is a continuation of U.S. patent application Ser. No. 13/234,191, filed Sep. 16, 2011. The entire contents of U.S. patent application Ser. No. 13/234,191 is hereby incorporated by reference.

FIELD

The embodiments described herein relate generally to mobile devices having a battery and, more particularly, to diagnostic use of physical and electrical battery parameters on mobile devices.

BACKGROUND

Wireless communication devices, personal data assistants and other types of mobile devices are commonly powered by internal power supplies, such as an internal battery or battery pack. The internal battery pack may be an assembly of one or more battery cells or battery modules that, depending on different factors, are capable of delivering a certain amount of charge to the mobile device in each given charging-discharging cycle. Different battery packs are designed to have different charge capacities, terminal voltages, charging characteristics, and discharging characteristics. Battery packs may be removable from the mobile device, for example, using a battery pack compartment in which the battery is housed using a securable cover. Alternatively, some battery packs may be "non-removable", in the sense that ready access to the battery pack compartment is more difficult to gain.

Many battery packs incorporate a battery ID resistor through which the mobile device may ascertain at least one of the type or model of a given battery pack. Typically, the battery ID resistor is connected between two external pins of the battery pack and has a characteristic resistance value that is allocated to the given battery model. A processor in the mobile device then measures the resistance of the battery ID resistor and determines one or both of the type and manufacture of the battery by comparing the measured resistance value against known values. If a match is found, the battery is identified.

More recently with the introduction of so-called "smart batteries", which may have an integrated battery processor or some other processing elements or circuitry in certain implementations, and in some cases storage memory, a main processor of the mobile device is able to identify different battery models by initiating a communication protocol with the battery processor. By way of example, according to the communication protocol, the main processor of the mobile device and a battery processor of the smart battery may be able to exchange different types of data and other information. In some cases, the battery processor transmits a battery ID value stored in the battery memory to the main processor to indicate the given battery model. Additional information relating to the charge capacity, charging characteristics and discharging characteristics of the battery may also be communicated to the main processor, for use by the main processor to control operation of the battery.

In addition to identifying a type or model of the battery, the communication protocol executed between the main processor and the battery processor may be used to authenticate the source of the smart battery. Some batteries may be manufactured by authorized sources, while other batteries may originate from third-party, non-authorized sources. Still other batteries may be counterfeit (i.e., passed off as being from an authorized source when they have not in fact originated from the authorized source). To authenticate the mobile device battery as being from an authorized source, the main processor may generate and send a challenge message to the battery processor. If the battery processor is able to generate the correct response message, for example by processing the challenge message with a cryptographic algorithm or other piece of cryptographic data, such as a cryptographic key, the battery is authenticated for use with the mobile device. However, an incorrect response message could indicate that the battery is not authentic or is counterfeit. Data integrity checks may also be utilized to ensure that an incorrect response message is due to the battery being inauthentic and not a data error during transmission.

BRIEF DESCRIPTION OF THE DRAWINGS

For a better understanding of the described embodiments and to show more clearly how they may be carried into effect, reference will now be made, by way of example, to the accompanying drawings in which.

DESCRIPTION OF EMBODIMENTS

Figure 1:
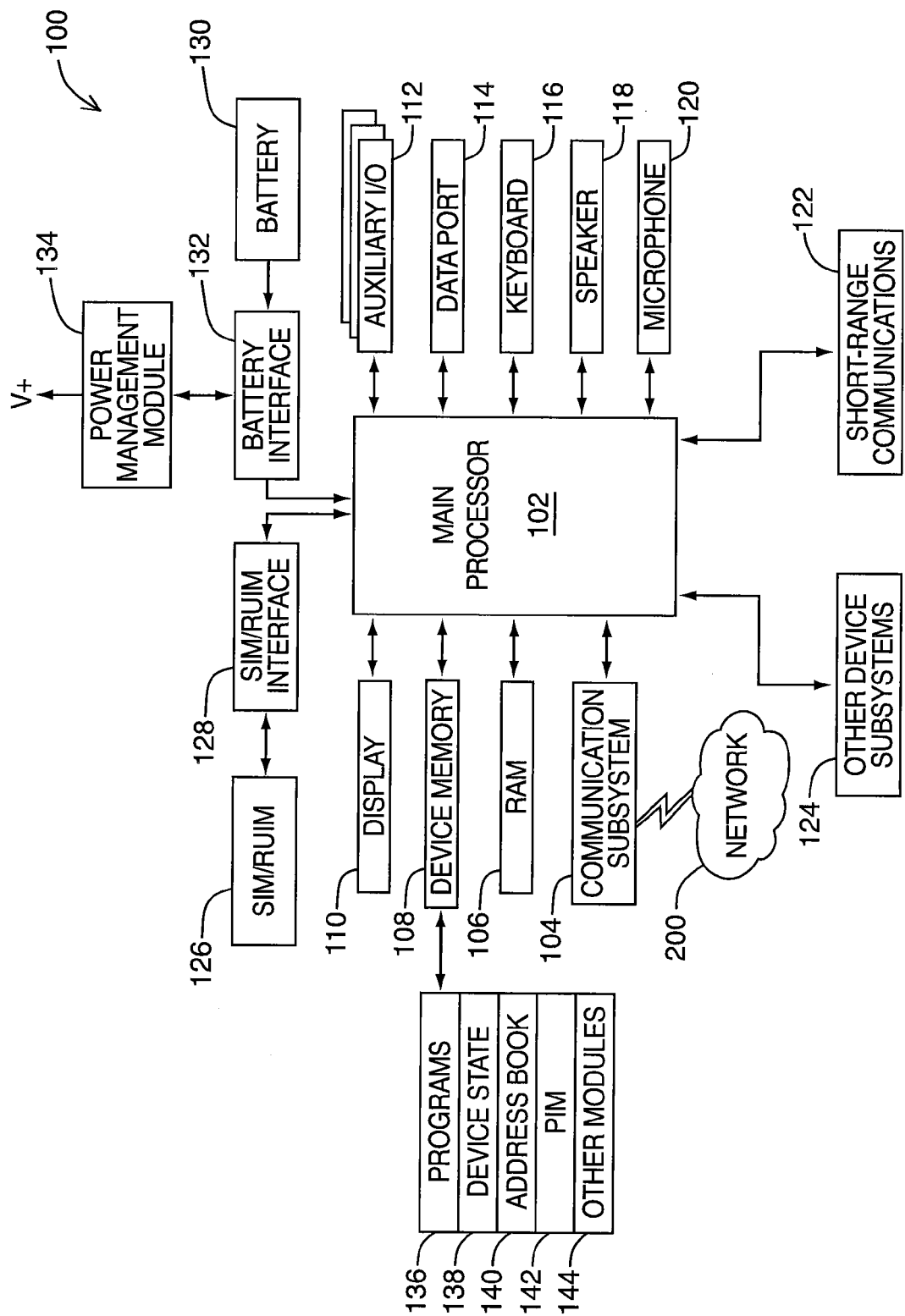
FIG. 1 is a block diagram of an example embodiment of a mobile communication device.

Being able to identify one or both of the type and model of a battery, as well as to authenticate the source of the battery, may be useful for one or more reasons. As one example, rechargeable batteries should generally be charged to the proper charge capacity and at the proper charging rate. If the battery is overcharged, the battery and the mobile device in which the battery is inserted may both become damaged. This situation becomes more common with increasing numbers of third-party unauthorized or counterfeit batteries made available on the market. The proper charge rate and capacity of an authorized battery may be ascertained once the battery is properly identified and authenticated.

Third-party unauthorized or counterfeit battery packs (also referred to herein more generally as inauthentic battery packs) may not generally have the same charge capacity, durability or lifespan of an authentic battery pack originating from an authorized manufacturing source. Inauthentic battery packs may be deficient in other ways as well, for example, by not having the required safety protection circuitry. Charging methods employed by the mobile device that were designed for authentic battery packs may be incompatible with inauthentic battery packs. Any of these differences in an inauthentic battery pack may cause the battery pack to fail during charging or through normal usage.

For battery packs that are identifiable using battery ID resistors, it may be possible to read the resistance value of the battery ID resistor and manufacture a third-party unauthorized or counterfeit battery pack having the same resistance value. From the standpoint of the mobile device, authentic batteries then become indistinguishable from the third-party unauthorized or counterfeit battery packs in terms of the battery ID resistor. The mobile device may then unintentionally authenticate a third-party unauthorized or counterfeit battery for use with the mobile device, even though the battery is not, in fact, authentic.

Use of smart battery technology somewhat enhances battery authentication and security. The processor integrated into the battery pack allows for a cryptographic authentication protocol to be implemented in the mobile device, for example, including challenge-response messages or public and private cryptographic keys. However, cryptographic authentication protocols may still not provide absolute security. For example, it may still be possible for a third party interested in manufacturing an unauthorized or counterfeit battery to intercept some piece of cryptographic data, such as a private key, which then enables the third-party to break the cryptographic authentication protocol. Thereafter, the inauthentic battery packs may again falsely appear to the mobile device as authentic battery packs.

As an alternative, or in addition to cryptographic authentication processes, the mobile device processor may make diagnostic use of various physical and electrical parameters of a battery pack to enhance battery authentication and security. Due to different physical geometries and fabrication processes, different battery packs will generally exhibit different characteristic responses during certain parts of the charging cycle, discharging cycle or both, as well as in response to different current demands. The characteristic responses may include electromagnetic or electrical responses or both. For example, the size and layout of the battery pack can contribute to the electrical and physical characteristics of the battery pack. The internal electrochemistry and structure of the battery cells or battery modules, such as a configuration of the battery windings, can also each contribute to the electrical and physical characteristics of the battery pack. Accordingly, under certain conditions, authorized battery packs produced by an authorized manufacturer will respond generally differently, as well as characteristically, in comparison to inauthentic battery packs.

Even if an inauthentic battery pack can be falsely authenticated by the main processor by presenting the correct battery ID resistor or response message as part of a cryptographic authentication protocol, the likelihood of the inauthentic battery pack exhibiting the same characteristic responses as an authentic battery pack in each of a variety of different charge and discharge conditions is extremely low. An average production run of a certain battery model might be, for example, between about 1 to 2 years, which places very tight time constraints on the third-party to match the manufacturing process of an authentic battery within the lifetime of the battery model. Third-party unauthorized and counterfeit batteries are also commonly manufactured using less expensive materials and processes than are used for authentic batteries. These and other factors make the likelihood of the authentic and inauthentic batteries having matched responses in each of the different conditions close to, if not, zero.

Even authentic batteries originating from the same source will not have identical geometries or perform identically under all conditions. For example, some inherent tolerance is typical even for tightly controlled manufacturing processes. Small deviations in physical battery geometry may translate into slightly different responses to being charged and discharged. Accordingly, the response of a given battery may be determined to match a reference response for authentic batteries of that model when there is a correlation between actual and expected performance within some acceptable range of values. In some cases, a criterion of matching or correlation may be used for making the determination. The criterion and the range of values may each be defined.

To increase the robustness of a security and authentication protocol based around battery physical and electrical properties, the degree of correlation between actual and reference response required for a positive match may be lowered, while the number of different test conditions may be increased. As noted above, the likelihood of a third-party unauthorized or counterfeit battery having a matched response in each of the variety of different conditions may be close to zero. An unidentified battery may therefore be tested under a sufficient number of different charging and discharging conditions until it can be concluded with an acceptable level of confidence that the battery is authentic. This authentication considers the physical and electrical properties of the battery. Use of battery ID resistors or cryptographic algorithms, which are each comparatively simpler to replicate in inauthentic batteries than are physical and electrical properties, are not required.

In one broad aspect, there is described herein an electronic device comprising: an interface for receiving a battery comprising a battery module for supplying power to the electronic device; and a power management module coupled to the battery and configured to: measure an electromagnetic radiation spectrum of the battery due to current flow in the battery module; compare the measured electromagnetic radiation spectrum of the battery to at least one of a plurality of reference electromagnetic radiation spectrums, each of the reference electromagnetic radiation spectrums corresponding with a different relative condition; determine a relative condition of the battery by comparing the measured electromagnetic radiation spectrum with one of the plurality of reference electromagnetic radiation spectrums; and store, in a memory store, data identifying the relative condition of the battery.

In another broad aspect, there is described herein an electronic device comprising: an interface for receiving a battery comprising a battery module for supplying power to the electronic device; and a power management module coupled to the battery and configured to: measure a voltage response of the battery due to current flow in the battery module; compare the measured voltage response of the battery to at least one of a plurality of reference voltage responses, each of the reference voltage responses corresponding with a different relative condition; determine a relative condition of the battery by comparing the measured voltage response with one of the plurality of reference voltage responses; and store, in a memory store, data identifying the relative condition of the battery.

In another broad aspect, the device further comprises the battery.

In another broad aspect, the device comprises a mobile communication device.

In another broad aspect, each of the reference electromagnetic radiation spectrums comprises an electromagnetic radiation spectrum of an authentic battery.

In another broad aspect, each of the reference voltage responses comprises a voltage response of an authentic battery.

In another broad aspect, the power management module is further configured to: store additional data obtained when determining the relative condition of the battery.

In another broad aspect, the additional data comprises an indication of when the relative condition of the battery was determined.

In another broad aspect, the relative condition of the battery comprises at least one of an age or state of health of the battery.

In another broad aspect, the power management module is configured to: repeat measuring the electromagnetic radiation spectrum, comparing the electromagnetic radiation spectrum, and determining the relative condition of the battery at a second time such that a second relative condition of the battery is determined; compare the second relative condition of the battery with the relative condition of the battery previously stored in the memory store; determine a rate of change between the second relative condition of the battery and the relative condition of the battery previously stored in the memory store; and determine if the rate of change exceeds a threshold tolerance level.

In another broad aspect, the power management module is configured to: repeat measuring the voltage response, comparing the voltage response, and determining the relative condition of the battery at a second time such that a second relative condition of the battery is determined; compare the second relative condition of the battery with the relative condition of the battery previously stored in the memory store; determine a rate of change between the second relative condition of the battery and the relative condition of the battery previously stored in the memory store; and determine if the rate of change exceeds a threshold tolerance level.

In another broad aspect, the power management module is further configured to: store additional data obtained when determining the relative condition of the battery; wherein the additional data is used when determining the second relative condition of the battery.

In another broad aspect, the power management module is further configured to output an indicator of a potential defect in the battery if the rate of change is determined to exceed the threshold tolerance level.

In another broad aspect, the power management module is configured to: repeat measuring the electromagnetic radiation spectrum, comparing the electromagnetic radiation spectrum, determining the relative condition of the battery, and storing the relative condition for a plurality of instances such that a plurality of relative conditions of the battery are determined over a period of time; compare the plurality of relative conditions of the battery stored in the memory store; determine a rate of change of relative condition of the battery over the period of time; and determine if the rate of change exceeds a threshold tolerance level.

In another broad aspect, the power management module is configured to: repeat measuring the voltage response, comparing the voltage response, determining the relative condition of the battery, and storing the relative condition for a plurality of instances such that a plurality of relative conditions of the battery are determined over a period of time; compare the plurality of relative conditions of the battery stored in the memory store; determine a rate of change of relative condition of the battery over the period of time; and determine if the rate of change exceeds a threshold tolerance level.

In another broad aspect, the power management module is further configured to output an indicator of a potential defect in the battery if the rate of change is determined to exceed the threshold tolerance level.

In another broad aspect, there is described herein a method for authenticating a battery for use with an electronic device, the battery comprising a battery module for supplying power to the electronic device, the method comprising: measuring an electromagnetic radiation spectrum of the battery due to current flow in the battery module; comparing the measured electromagnetic radiation spectrum of the battery to at least one of a plurality of reference electromagnetic radiation spectrums, each of the reference electromagnetic radiation spectrums corresponding with a different relative condition; determining a relative condition of the battery by comparing the measured electromagnetic radiation spectrum with one of the plurality of reference electromagnetic radiation spectrums; and storing, in a memory store, data identifying the relative condition of the battery.

In another broad aspect, there is described herein a method for authenticating a battery for use with an electronic device, the battery comprising a battery module for supplying power to the electronic device, the method comprising: measuring a voltage response of the battery due to current flow in the battery module; comparing the measured voltage response of the battery to at least one of a plurality of reference voltage responses, each of the reference voltage responses corresponding with a different relative condition; determining a relative condition of the battery by comparing the measured voltage response with one of the plurality of reference voltage responses; and storing, in a memory store, data identifying the relative condition of the battery.

In another broad aspect, the method further comprises: repeating the measuring, the comparing, and the determining such that a second relative condition of the battery is determined; comparing the second relative condition of the battery with the relative condition of the battery previously stored in the memory store; determining a rate of change between the second relative condition of the battery and the relative condition of the battery previously stored in the memory store; and determining if the rate of change exceeds a threshold tolerance level.

In another broad aspect, the method further comprises: storing additional data obtained when determining the relative condition of the battery; wherein the additional data is used when determining the second relative condition of the battery.

In another broad aspect, the method further comprises outputting an indicator of a potential defect in the battery if the rate of change is determined to exceed the threshold tolerance level.

In another broad aspect, the method further comprises: repeating the measuring, the comparing, the determining, and the storing for a plurality of instances such that a plurality of relative conditions of the battery are determined over a period of time; comparing the plurality of relative conditions of the battery stored in the memory store; determining a rate of change of relative condition of the battery over the period of time; and determining if the rate of change exceeds a threshold tolerance level.

In another broad aspect, the method further comprises outputting an indicator of a potential defect in the battery if the rate of change is determined to exceed the threshold tolerance level.

The embodiments described herein may, for example, generally have applicability in the field of data communication for mobile communication devices that use a "smart battery", which is a battery pack that is typically implemented with an embedded battery processor and other related circuitry to allow communication between the battery and the mobile device.

The embodiments described herein may primarily reference a mobile wireless communication device that has a main processor and is powered by a smart battery having a battery processor, a battery interface and related electronics. The battery interface is used for communication with one or more processors of the mobile device, such as a main processor or a power management module of the mobile device, as will be described in more detail below. However, it should be understood that the structure and functionality of the embodiments described herein may also be applied to a battery charger that charges a smart battery. Still other embodiments described herein may relate to battery packs that have no embedded processor or related electronics, i.e. a "passive" battery back.

The described embodiments generally relate to authenticating one or more batteries used for supplying power to an electronic device, which in some embodiments, may comprise a mobile communication device. A mobile communication device may also be referred to as a mobile device. In the case where the device is a mobile communication device, it may comprise a two-way communication device with advanced data communication capabilities having the capability to communicate in a wireless or wired fashion with other computing devices including other mobile communication devices. The mobile device may communicate with other devices through a network of transceiver stations. The mobile device may also include the capability for voice communications. However, depending on the functionality provided by the mobile device and the structure of the mobile device, it may be referred to as a data messaging device, a cellular telephone with data messaging capabilities, a wireless organizer, a wireless Internet appliance, a personal digital assistant, a smart phone, a handheld wireless communication device (with or without telephony capabilities), a wirelessly enabled notebook computer and the like.

To aid in understanding the general structure and operation of the mobile device with which the described embodiments operate, reference will be made to FIGS. 1 to 3. However, it should be understood that embodiments of the mobile device are not limited only to those which are specifically described herein.

Referring first to FIG. 1, shown therein is a block diagram of a mobile device 100 in one example implementation. The mobile device 100 comprises a number of components, the controlling component being a main processor 102, which controls the overall operation of mobile device 100. Communication functions, including data and voice communications, are performed through a communication subsystem 104. The communication subsystem 104 receives messages from and sends messages to a wireless network 200. In some implementations of the mobile device 100, the communication subsystem 104 is configured in accordance with the Global System for Mobile Communication (GSM) and General Packet Radio Services (GPRS) standards. The GSM/GPRS wireless network is used worldwide. Other standards that may be used include the Enhanced Data GSM Environment (EDGE), Universal Mobile Telecommunications Service (UMTS), Code Division Multiple Access (CDMA), Intelligent Digital Enhanced Network (iDEN™), and Long Term Evolution (LTE) standards. New standards are still being defined, and it will be understood by persons skilled in the art that the embodiments described herein may use any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 200 associated with the mobile device 100 is a GSM/GPRS wireless network in some implementations, other wireless networks may also be associated with the mobile device 100 in other implementations. The different types of wireless networks that may be employed include, for example, data-centric wireless networks, voice-centric wireless networks, and dual-mode networks that may support both voice and data communications over the same physical base stations. Combined dual-mode networks include, but are not limited to, Code Division Multiple Access (CDMA) or CDMA2000 networks, iDEN networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems.

The main processor 102 also interacts with additional subsystems such as a Random Access Memory (RAM) 106, a device memory 108, a display 110, an auxiliary input/output (I/O) subsystem 112, a data port 114, a keyboard 116, a speaker 118, a microphone 120, a short-range communication subsystem 122, and other device subsystems 124.

Some of the subsystems of the mobile device 100 perform communication-related functions, whereas other subsystems may provide "resident" or on-device functions. By way of example, the display 110 and the keyboard 116 may be used for both communication-related functions, such as entering a text message for transmission over the network 200, and device-resident functions such as a calculator or task list. Operating system software used by the main processor 102 is typically stored in a persistent store such as the device memory 108, which may alternatively be a read-only memory (ROM) or similar storage element (not shown). In some cases, the device memory 108 may be flash memory. Those skilled in the art will appreciate that the operating system, specific device applications, or parts thereof, may be temporarily loaded into a volatile store such as the RAM 106.

The mobile device 100 may send and receive communication signals over the wireless network 200 after required network registration or activation procedures have been completed. Network access is associated with a subscriber or user of the mobile device 100. To identify a subscriber, the mobile device 100 may require a SIM/RUIM card 126 (i.e. Subscriber Identity Module or a Removable User Identity Module) to be inserted into a SIM/RUIM interface 128 in order to communicate with a network. Accordingly, the SIM card/RUIM 126 and the SIM/RUIM interface 128 are entirely optional.

The SIM card or RUIM 126 is one type of a conventional "smart card" that may be used to identify a subscriber of the mobile device 100 and to personalize the mobile device 100, among other things. Without the SIM card 126, the mobile device 100 is not fully operational for communication with the wireless network 200. By inserting the SIM card/RUIM 126 into the SIM/RUIM interface 128, a subscriber may access all subscribed services. Services may include: web browsing and messaging such as e-mail, voice mail, Short Message Service (SMS), and Multimedia Messaging Services (MMS). More advanced services may include: point of sale, field service and sales force automation. The SIM card/RUIM 126 includes a processor and memory for storing information. Once the SIM card/RUIM 126 is inserted into the SIM/RUIM interface 128, the SIM card/RUIM 126 is coupled to the main processor 102. In order to identify the subscriber, the SIM card/RUIM 126 contains some user parameters such as an International Mobile Subscriber Identity (IMSI). An advantage of using the SIM card/RUIM 126 is that a subscriber is not necessarily bound by any single physical mobile device. The SIM card/RUIM 126 may store additional subscriber information for a mobile device as well, including datebook (or calendar) information and recent call information. Alternatively, user identification information may also be programmed into the device memory 108.

The mobile device 100 is a battery-powered device and may include a battery interface 132 for interfacing with a battery 130. In this case, the battery interface 132 is also coupled to a power management module 134, which is used to authenticate the battery 130, but also to assist the battery 130 in providing power to the mobile device 100. The main processor 102 may also be coupled to the power management module 134 for sharing information. However, in alternative embodiments, the battery interface 132 may be provided by the battery 130.

In addition to operating system functions, the microprocessor 102 enables execution of software applications 136 on the mobile device 100. The subset of software applications 136 that control basic device operations, including data and voice communication applications, will normally be installed on the mobile device 100 during manufacturing of the mobile device 100. The software applications 136 may include an email program, a web browser, an attachment viewer, and the like.

The mobile device 100 may further include a device state module 138, an address book 140, a Personal Information Manager (PIM) 142, and other modules 144. The device state module 138 may provide persistence, i.e. the device state module 138 ensures that important device data is stored in persistent memory, such as the device memory 108, so that the data is not lost when the mobile device 100 is turned off or loses power. The address book 140 may provide information for a list of contacts for the user. For a given contact in the address book, the information may include the name, phone number, work address and email address of the contact, among other information. The other modules 144 may include a configuration module (not shown) as well as other modules that may be used in conjunction with the SIM/RUIM interface 128.

The PIM 142 has functionality for organizing and managing data items of interest to a subscriber, such as, but not limited to, e-mail, calendar events, voice mails, appointments, and task items. A PIM application has the ability to send and receive data items via the wireless network 200. PIM data items may be seamlessly integrated, synchronized, and updated via the wireless network 200 with the mobile device subscriber's corresponding data items stored or otherwise associated with a host computer system. This functionality creates a mirrored host computer on the mobile device 100 with respect to such items. This may be particularly advantageous when the host computer system is the mobile device subscriber's office computer system.

Additional applications may also be loaded onto the mobile device 100 through at least one of the wireless network 200, the auxiliary I/O subsystem 112, the data port 114, the short-range communications subsystem 122, or any other suitable device subsystem 124. This flexibility in application installation increases the functionality of the mobile device 100 and may provide enhanced on-device functions, communication-related functions, or both. For example, secure communication applications may enable electronic commerce functions and other such financial transactions to be performed using the mobile device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The data port 114 may be any suitable port that enables data communication between the mobile device 100 and another computing device. The data port may be a serial or a parallel port. In some instances, the data port 114 may be a USB port that includes data lines for data transfer and a supply line that may provide a charging current to charge the mobile device 100.

The short-range communications subsystem 122 provides for communication between the mobile device 100 and different systems or devices, without the use of the wireless network 200. For example, the subsystem 122 may include an infrared device and associated circuits and components for short-range communication. Examples of short-range communication standards include those developed by the Infrared Data Association (IrDA), Bluetooth, RFID, NFC, and the 802.11 family of standards developed by IEEE.

In use, a received signal such as a text message, an e-mail message, or web page download will be processed by the communication subsystem 104 and input to the main processor 102. The main processor 102 will then process the received signal for output to the display 110 or alternatively to the auxiliary I/O subsystem 112. A subscriber may also compose data items, such as e-mail messages, for example, using the keyboard 116 in conjunction with the display 110 and possibly the auxiliary I/O subsystem 112. The auxiliary subsystem 112 may include devices such as: a touch screen, mouse, track ball, infrared fingerprint detector, or a roller wheel with dynamic button pressing capability. The keyboard 116 is preferably an alphanumeric keyboard and/or telephone-type keypad. However, other types of keyboards may also be used. A composed item may be transmitted over the wireless network 200 through the communication subsystem 104.

For voice communications, the overall operation of the mobile device 100 is substantially similar, except that the received signals are output to the speaker 118, and signals for transmission are generated by the microphone 120. Alternative voice or audio I/O subsystems, such as a voice message recording subsystem, may also be implemented on the mobile device 100. Although voice or audio signal output is accomplished primarily through the speaker 118, the display 110 may also be used to provide additional information such as the identity of a calling party, duration of a voice call, or other voice call related information.

Figure 2:
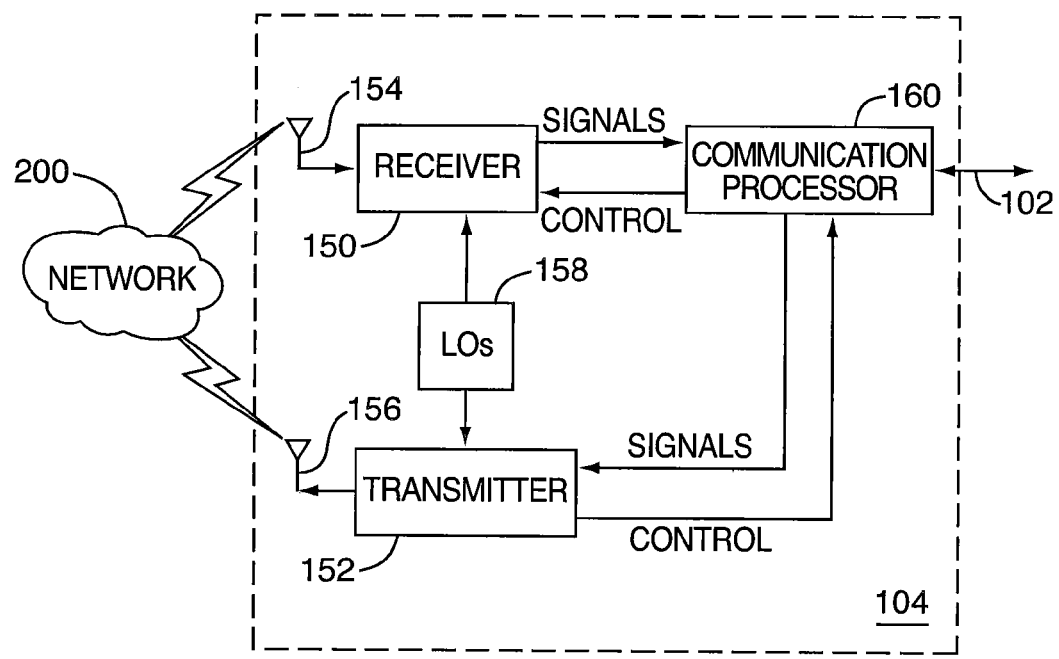
FIG. 2 is a block diagram of an example embodiment of a communication subsystem of the mobile communication device of FIG. 1.

Referring now to FIG. 2, a block diagram of an example embodiment of the communication subsystem component 104 of FIG. 1 is shown. The communication subsystem 104 comprises a receiver 150 and a transmitter 152, as well as associated components such as one or more embedded or internal antenna elements 154, 156, Local Oscillators (LOs) 158, and a communications processor 160 for wireless communication. The communications processor 160 may be a Digital Signal Processor (DSP). As will be apparent to those skilled in the field of communications, the particular design of the communication subsystem 104 may depend on the communication network with which the mobile device 100 is intended to operate. Thus, it should be understood that the design illustrated in FIG. 2 serves only as an example.

Signals received by the antenna 154 through the wireless network 200 are input to the receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed by the communications processor 160. In a similar manner, signals to be transmitted are processed, including modulation and encoding, by the communications processor 160. These processed signals are input to the transmitter 152 for digital-to-analog (D/A) conversion, frequency up conversion, filtering, amplification and transmission over the wireless network 200 via the antenna 156. The communications processor 160 not only processes communication signals, but also provides for receiver and transmitter control. For example, the gains applied to communication signals in the receiver 150 and transmitter 152 may be adaptively controlled through automatic gain control algorithms implemented in the communications processor 160.

The wireless link between the mobile device 100 and the wireless network 200 may contain one or more different channels, typically different RF channels, and associated protocols used between the mobile device 100 and the wireless network 200. An RF channel is a limited resource that should be conserved, typically due to limits in overall bandwidth and battery power of the mobile device 100.

When the mobile device 100 is fully operational, the transmitter 152 is typically keyed or turned on only when the transmitter 182 is sending to the wireless network 200 and is otherwise turned off to conserve resources. Similarly, the receiver 150 is periodically turned off to conserve power until the receiver 180 is needed to receive signals or information (if at all) during designated time periods.

Figure 3:
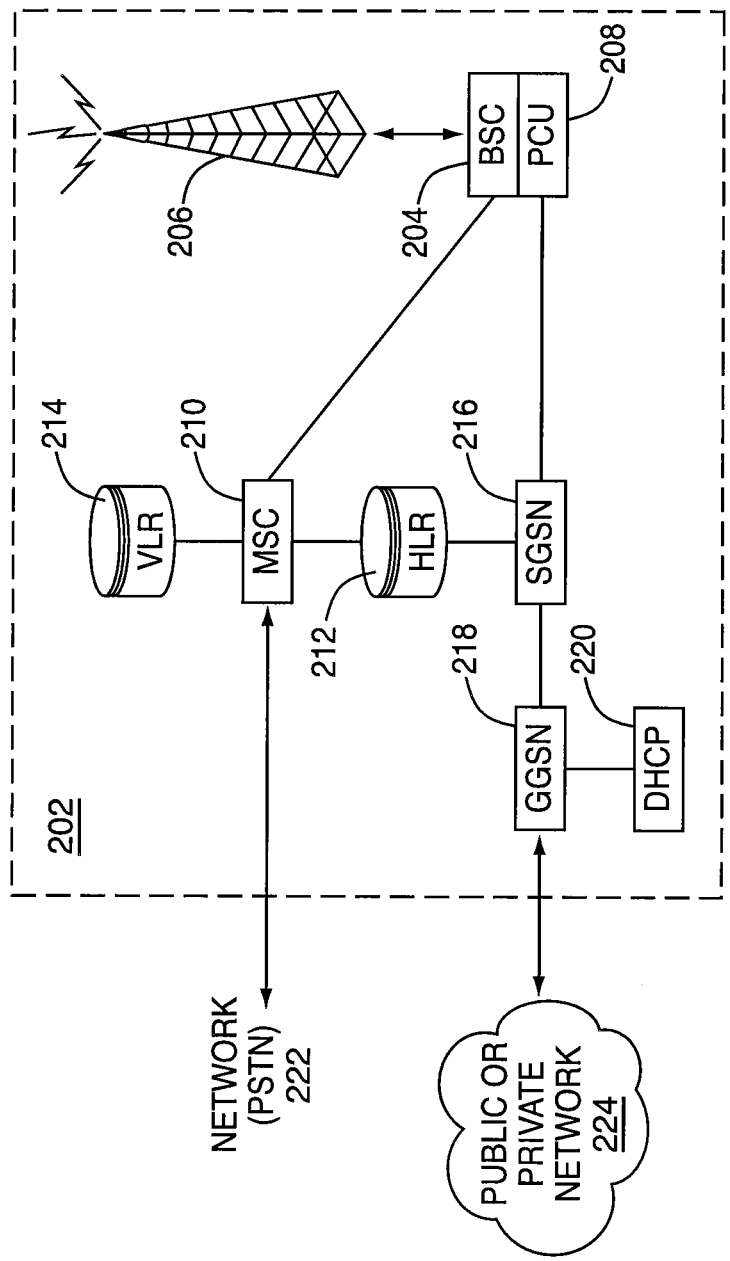
FIG. 3 is a block diagram of an example embodiment of a node of a wireless network with which the mobile communication device of FIG. 1 may communicate.

Referring now to FIG. 3, a block diagram of an example embodiment of a node of the wireless network 200 is shown as 202. In practice, the wireless network 200 comprises one or more nodes 202. The mobile device 100 communicates with the node 202. In the exemplary implementation of FIG. 3, the node 202 is configured in accordance with General Packet Radio Service (GPRS) and Global Systems for Mobile (GSM) technologies. The node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather an illustrative list of components that may be used in communications through the wireless network 200.

In a GSM network, the MSC 210 is coupled to the BSC 204 and to a landline network, such as a Public Switched Telephone Network (PSTN) 222 to satisfy circuit switching requirements. The connection through PCU 208, SGSN 216 and GGSN 218 to the public or private network (Internet) 224 (also referred to generally as a shared network infrastructure) represents the data path for GPRS capable mobile devices. In a GSM network extended with GPRS capabilities, the BSC 204 also contains a Packet Control Unit (PCU) 208 that connects to the SGSN 216 to control segmentation, radio channel allocation and to satisfy packet switched requirements. To track mobile device location and availability for both circuit switched and packet switched management, the HLR 212 is shared between the MSC 210 and the SGSN 216. Access to the VLR 214 is controlled by the MSC 210.

The station 206 is a fixed transceiver station. The station 206 and BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via the station 206. The fixed transceiver equipment normally performs such functions as modulation and possibly encoding (e.g., encryption) of signals to be transmitted to the mobile device 100 in accordance with particular communication protocols and parameters, under control of its controller. The fixed transceiver equipment similarly demodulates and possibly decodes (e.g., decrypts), if necessary, any communication signals received from the mobile device 100 within its cell. The communication protocols and parameters may vary between different nodes. For example, one node may employ a different modulation scheme and operate at different frequencies than other nodes.

For all mobile devices 100 registered with a specific network, permanent configuration data such as a user profile is stored in the HLR 212. The HLR 212 also contains location information for each registered mobile device and may be queried to determine the current location of a mobile device. The MSC 210 is responsible for a group of location areas and stores the data of the mobile devices currently in its area of responsibility in the VLR 214. Further, the VLR 214 also contains information on mobile devices that are visiting other networks. The information in the VLR 214 includes part of the permanent mobile device data transmitted from the HLR 212 to the VLR 214 for faster access. By moving additional information from a remote HLR 212 node to the VLR 214, the amount of traffic between these nodes may be reduced so that voice and data services may be provided with faster response times, while at the same time using fewer computing resources.

The SGSN 216 and GGSN 218 are elements added for GPRS support, namely packet switched data support, within GSM. The SGSN 216 and MSC 210 have similar responsibilities within the wireless network 200 by keeping track of the location of each mobile device 100. The SGSN 216 also performs security functions and access control for data traffic on the wireless network 200. The GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring the DHCP server 220 to be connected to the GGSN 218. There are many mechanisms for dynamic IP assignment, including using a combination of a Remote Authentication Dial-In User Service (RADIUS) server and DHCP server. Once the GPRS Attach is complete, a logical connection is established from the mobile device 100, through the PCU 208, and the SGSN 216 to an Access Point Node (APN) within the GGSN 218. The APN represents a logical end of an IP tunnel that may either access direct Internet compatible services or private network connections. The APN also represents a security mechanism for the wireless network 200, insofar as each mobile device 100 is assigned to one or more APNs, and the mobile devices 100 generally cannot exchange data without first performing a GPRS Attach to an APN that the mobile device 100 has been authorized to use. The APN may be considered to be similar to an Internet domain name such as "myconnection.wireless.com".

Once the GPRS Attach is complete, a tunnel is created and all traffic is exchanged within standard IP packets using any protocol that may be supported in IP packets. This includes tunneling methods such as IP over IP as in the case with some IPSecurity (IPsec) connections used with Virtual Private Networks (VPN). These tunnels are also referred to as Packet Data Protocol (PDP) contexts and there are a limited number of these available in the wireless network 200. To maximize use of the PDP Contexts, the wireless network 200 will run an idle timer for each PDP Context to determine if there is a lack of activity. When the mobile device 100 is not using the PDP Context allocated to the mobile device 100, the PDP Context may be de-allocated and the IP address returned to the IP address pool managed by the DHCP server 220.

Figure 4:
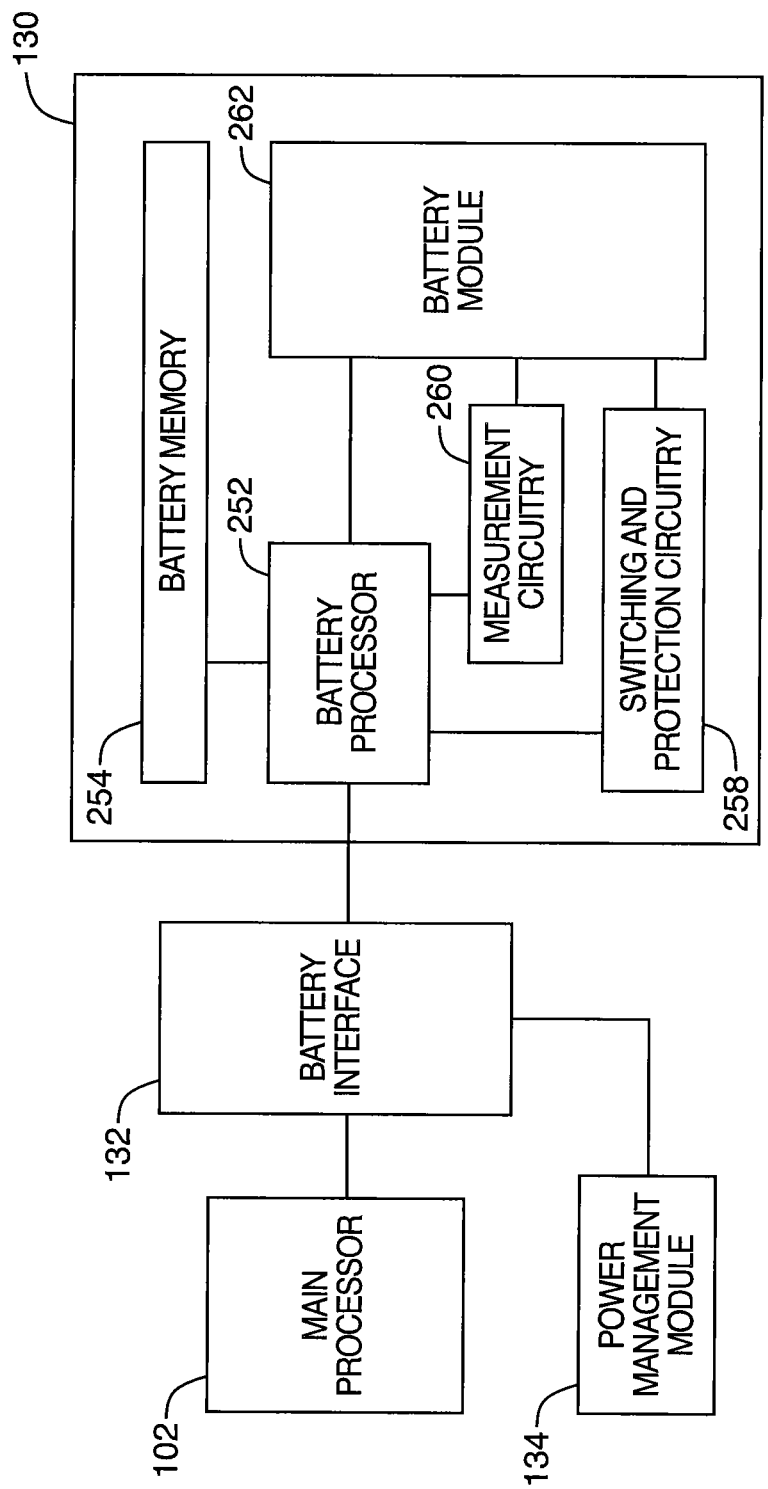
FIG. 4 is a block diagram of an example embodiment of a battery used to supply power to the mobile communications device of FIG. 1.

Referring now to FIG. 4, shown therein is a block diagram of an example embodiment of the battery 130 that may be used in a device such as the mobile device 100. The battery 130 includes a battery processor 252, a battery memory 254, switching and protection circuitry 258, measurement circuitry 260, including an analog to digital converter (not shown), and a battery module 262. The battery 130 is connected to the main processor 102 and to the power management module 134 through the battery interface 132.

In one example embodiment, the battery module 262 includes one or more battery windings. More generally, the battery module 262 may include one or more battery cells or charge storage devices, which are generally rechargeable over the life span of the battery 130, although the charge capacity of the battery windings may slowly deteriorate over time. The battery windings or cells may be made using nickel-cadmium, nickel-metal hydride or lithium-ion processes, or other suitable composite materials and the like. Further details of battery windings are provided below with reference to FIG. 10.

The battery module 262 provides supply power to the battery processor 252, which then provides the supply power to the main processor 102 via the battery interface 132, using suitable connections, such as via a system power bus. The battery interface 132 is shown in FIG. 4 external to the battery 130, but in alternative embodiments may be internal to the battery 130, or partially internal and partially external to the battery 130.

The battery processor 252 controls the operation of the battery 130 and may communicate with the main processor 102 via the battery interface 132. The battery processor 252 may include, for example, registers, stacks, counters, a watchdog timer, and other components (not shown) that are commonly used by a processor. The battery processor 252 may also include a clock (not shown). The battery 130 may store information in the battery memory 254. The battery memory 254 may comprise a combination of volatile and non-volatile memory. In some implementations, a single General Purpose Input/Output (GPIO) pin on the battery processor 252 may be connected to the main processor 102 across the battery interface 132 to receive instructions from the main processor 102 and to provide data to the main processor 102.

The measurement circuitry 260 may be used by the battery 130 to read certain data related to the operation of the battery module 262, such as battery current, battery voltage, battery temperature and the like. These measurements may be used to obtain an estimate of the amount of charge capacity remaining in the battery module 262. To perform these measurements, the measurement circuitry 260 includes an analog to digital converter (ADC) (not shown). The measurement circuitry 260 may be optional, since in alternative embodiments, the mobile device 100 rather than the battery 130, may include circuitry for performing the functionality of the measurement circuitry 260.

The switching and protection circuitry 258 may be used to protect the battery 130. The switching and protection circuitry 258 may act like a circuit breaker and may be activated by the battery processor 252 or the main processor 102 under certain situations to prevent the battery 130 from being damaged during use. For instance, the switching and protection circuitry 258 may include a thermal breaker to disable the battery 130 when the temperature of the battery module 262 becomes too high. The thermal breaker may also disconnect the battery 130 under high current loads if other protection circuitry fails. The switching and protection circuitry 258 may also protect against short circuits, under-voltage conditions, over-voltage charging, reverse polarity being applied to the battery 130, etc. Accordingly, the switching and protection circuitry 258 may also be used during the charging, discharging or pre-charging of the battery module 262, as well as for battery cell balancing. Additional protection circuitry may also be included in the battery interface 132 in some embodiments.

The battery 130 is also connected to the power management module 134 of the mobile device 100 via the battery interface 132. The power management module 134 communicates with the battery processor 252 to take measurements of different operating characteristics of the battery module 262 using the measurement circuitry 260. For example, the battery current (charging or discharging), terminal voltage and temperature of the battery module 262 may be measured.

The power management module 134 may request that various measurements of the battery module 262 be taken under specific conditions. In some cases, the specific conditions arise during normal operation of the battery 130, such as different operations performed by the main processor 102 or the communication subsystem 104 (FIG. 1). As a non-limiting example, the power management module 134 may take battery measurements during an incoming GSM pulse received into the communication subsystem 104, when there is a substantial current demand on the battery module 262. The power management module 134 may also request that measurements of the battery module 262 be taken during charging of the battery module 262, or alternatively during power on of the mobile device 100.

In some cases, rather than taking measurements of the battery module 262 for naturally occurring conditions during operation of the mobile device 100 (e.g., an incoming GSM pulse), the power management module 134 may instead temporarily interrupt normal operation of the mobile device 100 in order to subject the battery module 262 to artificially created charging or discharging conditions. For example, the power management module 134 may request a certain current draw (e.g., 1C, 2C, 0.5C, etc.) on the battery module 262, and then measure the response of the battery module 262 to the requested current draw. Alternatively, the power management module 134 may charge the battery module 262 with a certain charge current, such as those noted above. As will be appreciated, "1C" represents the magnitude of a current that would fully charge or drain the battery module 162 in one hour, and a "2C" current has twice the magnitude of a 1C current.

Alternatively, or additionally, the time duration and other external conditions of the battery module 262, such as temperature, may be controlled by the power management module 134 to measure the response of the battery module 262. Optionally, one or both of a heating element and cooling element (not shown) may be included in the battery 130 for temperature control by the power management module 134. A certain AC current (charging or discharging) may also be applied to the battery 130 in order to measure the response of the battery module 262.

In accordance with at least one embodiment described herein, the response measured by the power management module 134 may comprise a terminal voltage or current of the battery module 262. Alternatively or additionally, the measurement response may comprise a secondary quantity generated based on the terminal voltage or current of the battery module 262. For example, the power management module 134 may measure a complex impedance or charge differential of the battery module 262.

The power management module 134 may request, via the battery processor 252, that the measurement circuitry 260 measure the terminal voltage or battery current of the battery module 262 in order to characterize the electrical response of the battery module 262 under different conditions. Alternatively, an electromagnetic response of the battery module 262, such as an electromagnetic radiation spectrum, may be characterized. The response of the battery module 262 may be measured under different known conditions in which characteristic responses of authentic batteries are observable, and which would generally not all be reproducible in inauthentic batteries within the typical production run of the battery 130. Because authentic batteries are likely to exhibit each characteristic response to some degree, while inauthentic batteries are far less likely to exhibit the characteristic responses, the power management module 134 may authenticate the battery 130 by comparing the characterized responses of the battery module 262 with corresponding reference responses that have been determined for authentic batteries and stored in the power management module 134.

In some embodiments, the power management module 134 may perform authentication of the battery 130 based on a single characteristic response of the battery module 262. This may be appropriate, for example, where the actual measured response of the battery module 262 is very close to reference values over the entire life of the battery 130. In such cases, characterization of a single response of the battery module 262 may adequately distinguish between authentic and inauthentic batteries, and with enough accuracy to provide a basis for authentication of the battery 130.

In some embodiments, to increase the robustness of the authentication process, the power management module 134 may characterize a number of different responses of the battery module 262 taken under different conditions. Further description of some example responses is provided below. If at least a threshold number of the characterized responses are matched to corresponding reference responses, then the power management module 134 authenticates the battery 130. As needed, the power management module 134 may characterize additional responses of the battery module 262 until a positive authentication is made.

However, if fewer than the threshold number of characterized responses of the battery module 262 match corresponding reference responses stored in the power management module 134, the battery 130 is not authenticated for use with the mobile device 100. In such cases of a failed authentication, the battery 130 may be identified as a third-party unauthorized or counterfeit battery or, optionally, additional responses may be characterized before the battery 130 is determined to be inauthentic. The threshold number of characterized responses required to establish a positive or failed authentication is variable and may depend on the desired robustness, exactness, or both robustness and exactness of the authentication process.

In any case of a failed authentication, the main processor 102 may then initiate further processing or sequences as a precaution to reduce the possibility of the inauthentic battery causing damage to the mobile device 100. As noted above, damage may be caused to the mobile device by charging of the battery 130 using methods designed for authentic battery packs and that are incompatible with inauthentic battery packs.

As some non-limiting examples, if the battery 130 is identified as a third-party unauthorized or counterfeit battery, then the main processor 102 may execute software that provides user feedback, controls radio access, and prevents the mobile device 100 from operating for longer than a certain time, etc. In some embodiments, the main processor 102 will not charge an inauthentic battery pack (e.g., a battery pack that fails the authentication process) or will only permit charging to a maximum terminal voltage occurring at less than full charge capacity. This way, the likelihood of overcharging the battery 130 is reduced. In other embodiments, if the battery 130 is identified as a third-party unauthorized or counterfeit battery, then the main processor 102 may be configured to not allow the mobile phone 100 to operate in its normal mode of operation. Instead, the main processor 102 may be configured to provide an indication that the battery 130 is not authenticated for use. For example, the main processor 102 can cause a suitable graphical indication to be displayed on the display 110 (FIG. 1).

In some embodiments, the power management module 134 may communicate with the battery processor 252 ahead of performing authentication to receive an indication of the model of the battery 130. For example, the power management module 134 may read the value of the battery ID resistor or request a battery ID value from the battery processor 252 to indicate the battery model. Optionally, the power management module 134 may also perform a preliminary cryptographic authentication of the battery 130 (although as noted above, some inauthentic batteries may pass the cryptographic authentication despite not being, in fact, authentic).

After obtaining the indication of the battery model, the power management module 134 then selects one or more specified responses stored in the power management module 134 associated with the indicated battery model for comparison with the characterized response of the battery 130. In the case of an inauthentic battery, even if the battery 130 successfully provides the correct battery ID or passes the preliminary cryptographic authentication, the power management module 134 may perform authentication of the battery 130 based on the measured physical and electrical parameters of the battery module 262. The battery 130 will be determined by the power management module 134 to be inauthentic, even if otherwise appearing to be an authentic battery, should the battery 130 be unable to reproduce the reference electrical or electromagnetic responses for authentic batteries of the indicated model under the various different conditions.

Because some variation may occur between even authentic batteries manufactured from the same authorized source, the characterized response of the battery 130 may not exactly match the reference electrical or electromagnetic response. Accordingly, the power management module 134 may define criteria for determining a positive match between the characterized response of the battery module 262 and the corresponding reference response. The criteria for a positive match may be defined by the power management module 134 to provide some flexibility.

As some non-limiting examples, the power management module 134 may define a range of values for one or more particular features of the reference response. Corresponding features of the characterized response must then be within the defined range before a positive match is determined. Alternatively, the power management module 134 may determine a degree of correlation between the characterized and reference electrical responses, such as by performing curve fitting, statistical analysis and the like, and determine a match between the characterized and reference responses if there is sufficient correlation. Alternatively, the power management module 134 may process measurements taken directly from the battery module 262, such as terminal voltage and battery current, to compute derivative quantities, and to characterize the response of the battery module 262 based on the derivative quantities.

Various additional factors beyond manufacturing quality also affect the response of the battery 130 to different charge conditions. For example, the battery module 262 will behave differently under different temperatures and under different charging or discharging currents (e.g., 1C, 2C, 0.5C, etc.). Batteries of different ages or states of health or that have been cycled a different number of times will also behave differently. For example, a battery can be said to age with each cycle of charging and discharging, so that a heavily cycled battery will have a different "age" than a fresh or lightly cycled battery. Aging will also generally cause the physical and structural integrity (e.g., "state of health") of the battery to slowly degrade over time. Accordingly, each of the terms "age" and "state of health", as the skilled person will understand, may reflect the condition of the battery module 262 relative to an initial condition (referred to herein as a "relative condition" indicator of the battery). As discussed in more detail below, each of these different conditions may affect one or more different electrical or electromagnetic responses of the battery module 262.

Reference electrical or electromagnetic responses for the battery 130 may be specified for different electrical excitations of the battery 130, such as different charging or discharging currents, but also for the different external conditions of the battery 130 noted above, such as age or temperature. The power management module 134 may select which of the specified electrical or electromagnetic responses to compare with the characterized electrical or electromagnetic response of the battery 130 based on the given conditions of the battery. For example, the power management module 134 may select a particular reference response that has been specified for a given charging or discharging current and at a particular temperature. In some embodiments, a temperature sensor (not shown) may be used to detect the temperature of the battery 130 for use by the power management module 134 in selecting a specified electrical or electromagnetic response for comparison.

In some embodiments, if the battery 130 is successfully authenticated as being from an authorized source, based on the one or more characterized electrical or electromagnetic responses, the power management module 134 additionally may estimate a relative condition of the battery 130. As the battery 130 ages from its initial condition, its electrical performance may change over time. Each different characteristic response of the battery 130 is specified for authentic batteries of different ages or states of health. However, in some embodiments, the relative condition of the battery 130 may be determined at the same time that the battery 130 is authenticated as being from an authorized source. In variant embodiments, the relative condition of the battery 130 may also be determined without requiring that that battery 130 be specifically authenticated as being from an authorized source.

By way of example, after first authenticating a particular model of the battery 130, the power management module 134 may then estimate the relative condition of the battery 130 by comparing the characterized response for the battery module 262 to one of the different reference responses for authentic batteries of different ages. The specified response most closely matching the characterized response provides the basis for estimating the relative condition of the battery 130. To increase the accuracy of the estimate or to validate an assessment of the relative condition (e.g. age) of the battery, the power management module 134 can perform multiple different comparisons. The relative condition of the battery 130 can be determined based upon which estimate provides the closest overall match across all comparisons of characterized and reference electrical responses.

Over time, estimates of the relative condition of the battery may be reassessed. Even if an inauthentic battery managed to mimic an authentic and healthy battery in a first estimation of relative condition, the degradation pattern of the battery would be highly unlikely to maintain that match. In a worst-case scenario, an unauthentic battery might go unnoticed for a limited number of cycles. As noted below, maintaining a history of determined estimates of the relative condition of the battery may assist in the determinations of the authenticity, age, and state of health of a battery.

In some embodiments, if the power management module 134 determines that the battery 130 is in moderate or relatively poor condition as compared to a fresh battery, for example due to heavy cycling of the battery 130, the power management module 134 may take a specified action to alert the user of the mobile device 100 to the degrading condition of the battery 130. For example, but without limitation, the power management module 134 may instruct the main processor 102 to display a warning on the display 110 (FIG. 1). The display may indicate an estimate of the remaining usable life of the battery 130, which provides the user with some indication of when to replace the battery 130. In some other cases, for example, where the relative condition of the battery 130 has degraded even further, the main processor 102 may even disable further use of the mobile device 100 until the battery 130 is replaced with a new battery.

In one example embodiment, the ability of the power management module 124 to determine the relative condition of battery 130, which may reflect the age and state of health of battery 130, allows for a prediction of when battery 130 is predicted to fail. This application may also be referred to as "warranty prediction". When the relative condition of battery 130 is determined, and it is predicted that the battery 130 will fail within a certain period of time or that failure is imminent, a corresponding data message, signal or other indicator may be automatically transmitted by the mobile device 100 to, for example, the manufacturer of the mobile device 100 or battery 130. If many batteries are predicted to fail within the same period of time, this may provide the manufacturer with advance notice of this condition, allowing the manufacturer to plan accordingly (e.g. prepare to deal with a recall or mass return of battery stock, plan for an increase in the sale of new batteries, etc.).

In another example embodiment, the ability of the power management module 124 to determine the relative condition of battery 130 may also allow batteries purported to be of a certain age or condition to be verified. For example, if an authentic battery is being sold as a "new" battery when in fact the battery has been heavily cycled despite appearing cosmetically to be a new battery, the power management module 124 may be configured to act as an "age meter" for example, to determine the age of the battery, or to verify that the age or condition (or both) of the battery is consistent with the age or condition (or both) that it is purported to be in.

Some different electrical or electromagnetic responses of the battery module 262 that may be used as a basis for authenticating the battery 130, or for estimating the relative condition of the battery 130, or both, will now be described. Each of the described electrical or electromagnetic responses may be used by the power management module 134 independently or in combination with any number of the other described electrical or electromagnetic responses to authenticate or estimate the relative condition of the battery 130. Accordingly, a positive match may be required for any one, some combination of more than one, or in some cases all of the described electrical or electromagnetic responses, before the battery 130 will be authenticated. In the event that one or more of the electrical or electromagnetic responses not match, the main processor 102 may initiate one of the above-described procedures for handling a failed authentication of the battery 130.

For convenience, the different electrical or electromagnetic responses described herein are organized under section headings. However, it should be appreciated that the following list is illustrative only and not exhaustive of the possible different electrical or electromagnetic responses of the battery module 262 that may be used in the described embodiments to enhance battery security and authentication. Use of section headings shall not have the effect of limiting the scope of the described embodiments in any way.

Battery Capacity

Figure 5A:
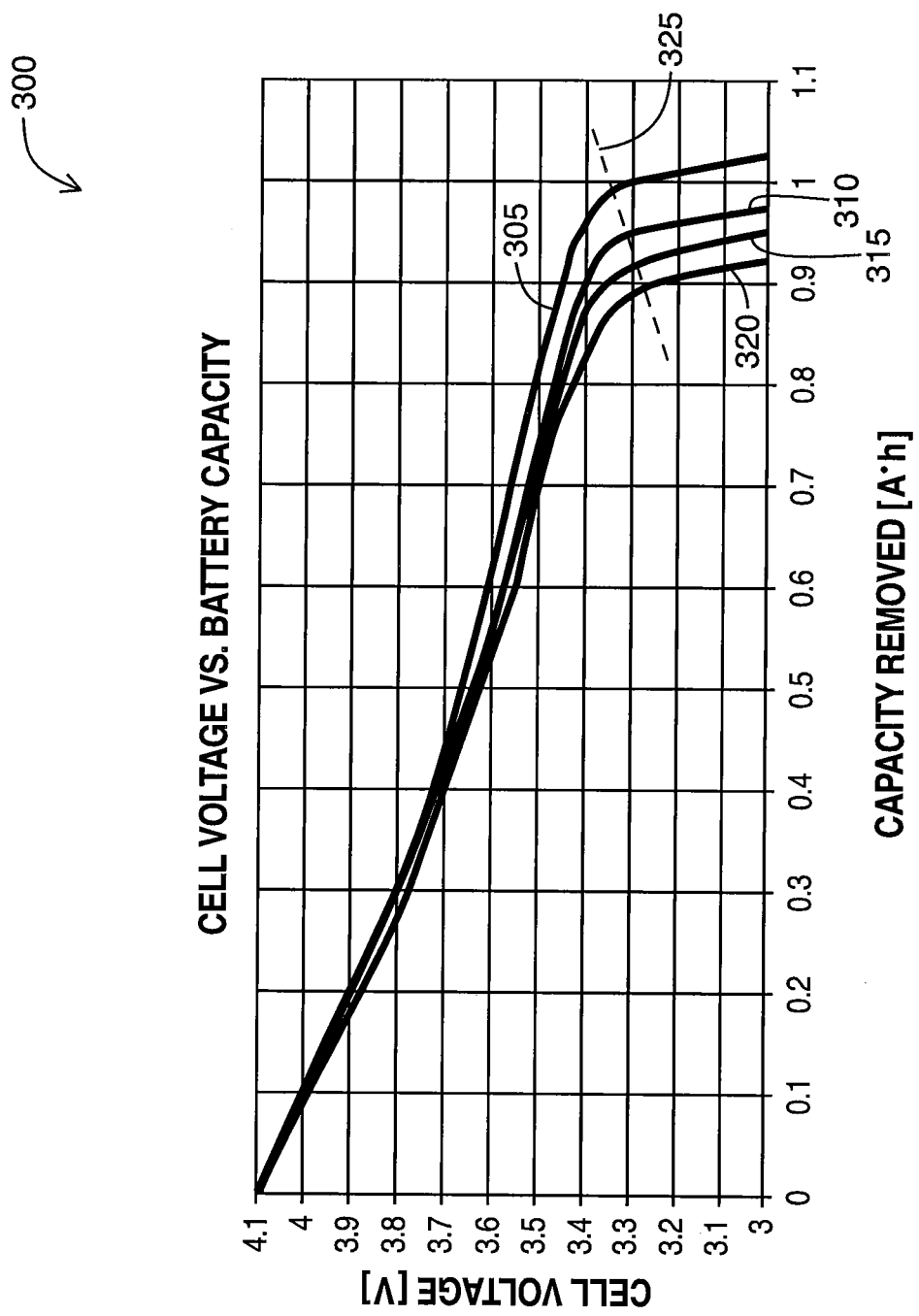
FIG. 5A is a graph showing a relationship between cell voltage and battery capacity at different points in the life cycle of an authentic battery.
Figure 5B:
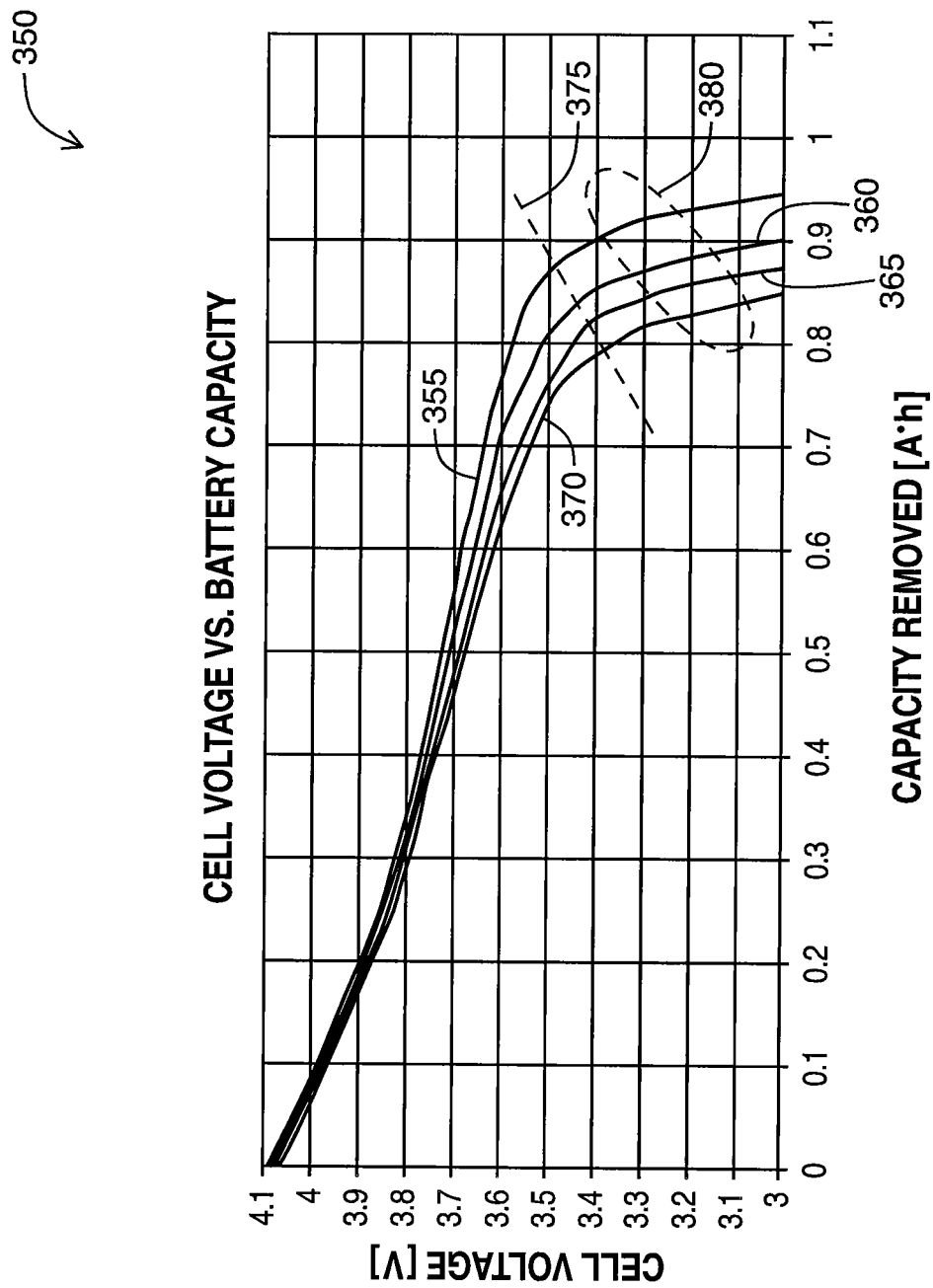
FIG. 5B is a graph showing a relationship between cell voltage and battery capacity at different points in the life cycle of an inauthentic battery.

Referring now to FIGS. 5A and 5B, the relationship between cell voltage and battery capacity over time for authentic and inauthentic batteries is illustrated. Graph 300 in FIG. 5A plots cell voltage on the y-axis (in volts, V) against capacity removed on the x-axis (in ampere-hours, A·h) at various representative points throughout the life of an authentic battery. In graph 300, cell voltage represents the terminal voltage measured at output terminals of battery module 262, while capacity removed represents the charge removed (or alternatively stored) in the battery module 262 over a single charge cycle normalized by the capacity of the battery 130. As will be appreciated, 1 A·h is equivalent to the amount of electric charge (in Joules, J) that 1 A of current transfers in 1 h of time and, therefore, graph 300 could be re-written with units of Joules on the x-axis.

For an authentic battery manufactured by an authorized source, the cell voltage and charge removed (or stored) in the battery module 262 will be characteristically related to one another as shown in FIG. 5A. Curve 305 represents the characteristic relationship between cell voltage and charge capacity when the battery 130 (FIG. 4) is new. Curves 310, 315 and 320 represent the relationship between these two battery parameters as the battery 130 ages, for example, in four-month intervals. Thus, curve 310 may represent the relationship between cell voltage versus charge removed when the battery 130 is 4 months old, curve 315 may represent the relationship when the battery 130 is 8 months old, and curve 320 may represent the relationship when the battery 130 is 12 months old, although these battery ages are examples only.

As indicated by FIG. 5A, the age of the battery 130 generally affects the relationship between cell voltage and charge capacity of the battery module 262. For example, the charge capacity of the battery 130 generally decreases over the lifetime of the battery 130, so that in older or more degraded batteries, progressively less charge tends to be stored or removed per unit voltage change from full charge (at approximately 4.1V). In other words, the battery 130 over time gradually loses the ability to store charge due to aging or wearing out. This degradation of the relative condition of the battery 130 is indicated by the trendline 325 on graph 300.

During operation of the mobile device 100, power management module 134 (FIG. 4) monitors the terminal voltage of the battery module 262 (FIG. 4), as well as the battery current discharged from the battery module 262 as a function over time to compute capacity removed. From these two measured battery parameters, power management module 134 is able to characterize the voltage-capacity response of the battery 130. Alternatively, the power management module 134 may monitor the terminal voltage and charging current of the battery module 262 during charging in order to characterize the voltage-capacity response of the battery 130.

In addition to age or state of health, the voltage-capacity response of the battery 130 will generally depend on other conditions of the battery 130. Curves 305, 310, 315 and 320 therefore represent the voltage-capacity response of the battery 130 only under a given set of conditions and would not generally be identical for different conditions of the battery 130. Different conditions for the battery 130 would typically generate different cell voltage-charge capacity responses.

As some non-limiting examples, curves 305, 310, 315 and 320 may be generated for a particular operating temperature of the battery module 262 and for a particular rate of charge or discharge. Although not specifically illustrated on graph 300, additional voltage-capacity responses of the battery 130 for multiple different temperatures, different charge or discharge rates, or both different temperatures and different charge or discharge rates are specified and stored in the power management module 134.

Referring now to graph 350 of FIG. 5B, the power management module 134 may also use the voltage-capacity response characterized for the battery 130 as a basis for authenticating that the battery 130 was produced by an authorized source. Curves 355, 360, 365 and 370 correspond to the voltage-capacity responses of an inauthentic battery that are measured under the same conditions as curves 355, 360, 365 and 370, shown in FIG. 5A, which were measured for an authentic battery. Trendline 375 on graph 350 shows that the relative condition of inauthentic batteries can be predicted to degrade over time as well. Region 380 on graph 350 indicates the general location of the trendline 325 in FIG. 5A.

As seen from FIG. 5B, the features of curves 355, 360, 365 and 370 for the inauthentic battery do not exactly match the features of curves 305, 310, 315 and 320 shown in FIG. 5A for the authentic battery. For example, trendline 375 on graph 350 is drawn through the respective knee-points of curves 355, 360, 365 and 370, which roughly correspond to the full charge capacity of the battery 130 for a given age. Region 380 drawn on graph 350, which indicates the location of the corresponding knee-points of curves 305, 310, 315 and 320 for the authentic battery, does not align with trendline 375.

Accordingly, in some embodiments, the power management module 134 may estimate the charge capacity of the battery 130 by detecting the knee-point of the voltage-capacity response, and compare the estimated charge capacity against reference values. Using the results of the comparison, alone or in combination with other comparisons, the power management module 130 may authenticate or estimate the relative condition of the battery 130, or both. Authentic batteries will lose their charge capacity at different rates in comparison to inauthentic batteries, which will be detectable by the power management module 134 in at least some cases.

Charge Differential

Figure 6A:
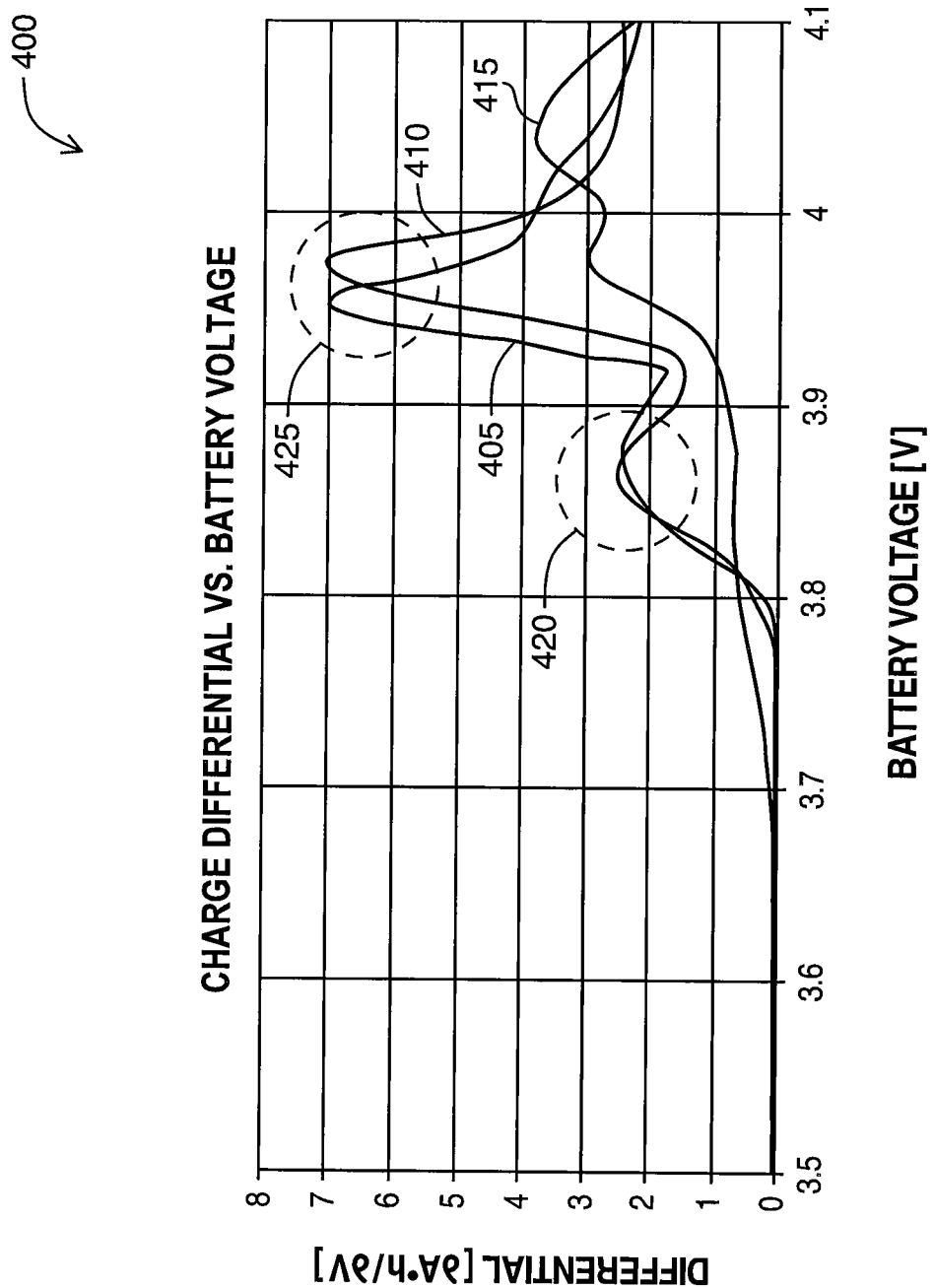
FIG. 6A is a graph showing a relationship between charge differential and battery voltage for both authentic and inauthentic batteries.
Figure 6B:
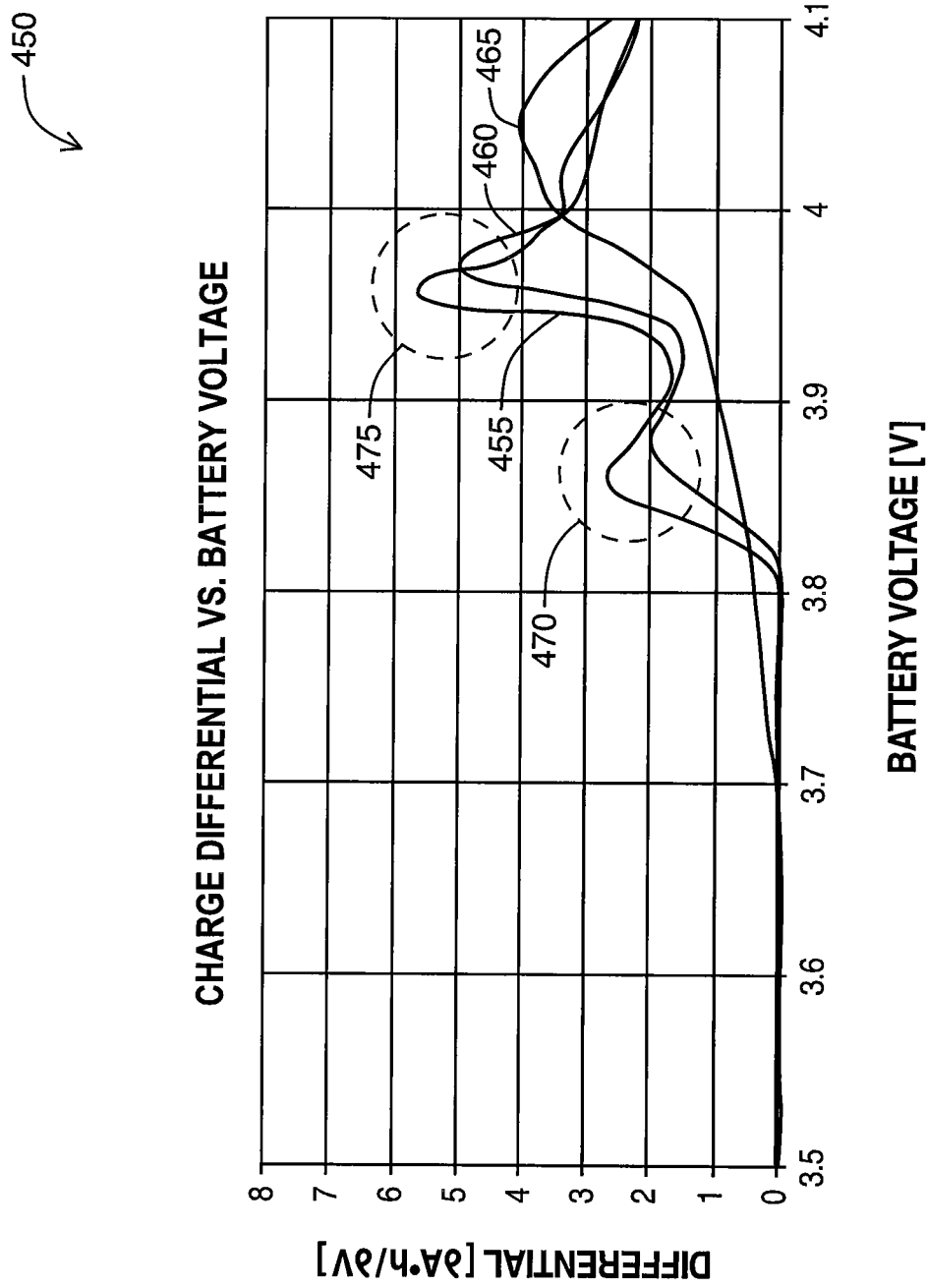
FIG. 6B is a graph showing a relationship between charge differential and battery voltage for both authentic and inauthentic batteries that have been heavily cycled.

Referring now to FIGS. 6A and 6B, the relationship between charge differential and battery voltage for authentic and inauthentic batteries is illustrated. Graph 400 in FIG. 6A plots charge differential on the y-axis (in units of ampere-hours per volt, (A·h)/V) against battery voltage on the x-axis (in units of volts, V) for a new battery. In graph 400, the plotted charge differential represents a rate of change of a charge capacity of the battery module 262 during charging with respect to a terminal voltage of the battery module 262. The charge differential is plotted as a function of the terminal voltage of the battery module 262.

Each point on a curve plotted on graph 400 represents, for a different terminal voltage of the battery module 262, the incremental charge delivered to the battery module 262 that results in a corresponding incremental increase in the terminal voltage of the battery module 262. Curves 405 and 410 represent the responses of two different authentic batteries manufactured from two different authorized sources. Curve 415 represents the response of an inauthentic battery. Each of curves 405, 410 and 415 are generated from measurements taken during charging of a new battery and under equivalent external conditions (e.g., temperature).

As can be seen from FIG. 6A, depending on the particular controls imposed on the manufacturing process, two different authentic batteries from two different authorized sources may exhibit a similar charge differential response during charging. However, in at least some cases, inauthentic batteries would not generally exhibit a response identical with the response of authentic batteries.

For example, curves 405 and 410 have generally similar trajectories and each show characteristic features at approximately the same locations. Region 420 indicated on graph 400 shows that curves 405 and 410 each experience a local maximum of between 2 and 3 (A·h)/V for a battery module 262 terminal voltage at between approximately 3.8 V and approximately 3.9 V. Region 425 shows that curves 405 and 410 each also experience another local maximum of approximately 7 (A·h)/V for a battery module 262 terminal voltage at between approximately 3.9 V and approximately 4.0 V. While illustrated numerically for ease of reference, it should be appreciated that curves 405 and 410 are not restricted only to the values or ranges specifically indicated.

For the same conditions, curve 415 corresponding to the inauthentic battery does not exhibit the same general features as curves 405 and 410 corresponding to the authentic batteries. As one example, while curve 415 experiences a local maximum between approximately 3.9 V and approximately 4.0 V, the value of the local maximum is only about 3 (A·h)/V and does not coincide with region 425. As another example, curve 415 does not exhibit any appreciable local maximum between approximately 3.8 V and approximately 3.9 V corresponding to the region 420. As a third example, curve 415 also shows a second local maximum between approximately 4.0 V and approximately 4.1 V, where no corresponding local maximum is observed in curves 405 and 410.

In some embodiments, during charging of the battery module 262, the power management module 134 (FIG. 4) measures the terminal voltage and charging current supplied to the battery module 262 as a function of time to characterize the charge differential response of the battery 130 (FIG. 1), i.e., to generate a curve 405, 410 or 415. The power management module 134 then compares one or more features of the characterized charge differential response against reference charge differential responses that have been specified for authentic batteries and stored in the power management module 134. Based on the results of the comparison (optionally with other comparisons), the power management module 134 may authenticate or estimate the relative condition of the battery 130.

Referring now to FIG. 6B, graph 450 illustrates the charge differential response for the same batteries as in graph 400 of FIG. 6A, but after each of the batteries has been aged, such as through heavy cycling. Graph 450 has the same units and is plotted on the same scale as graph 400 shown in FIG. 6B. Curves 455 and 460 represent the responses of the two authentic batteries, and curve 465 represents the response of the inauthentic battery. Each of curves 455, 460 and 465 is generated again from measurements taken during charging under equivalent external conditions (e.g., temperature).

As will be appreciated from FIG. 6B, even after aging, the charge differential responses of the two authentic batteries manufactured from different authorized sources remain similar and distinguishable from the charge differential response of the inauthentic battery. For example, curves 455 and 460 again each experience a local maximum, which is indicated by region 470, for a battery terminal voltage of between approximately 3.8 V and approximately 3.9 V. Curves 455 and 460 also each experience a second local maximum at between approximately 3.9 V and approximately 4.0 V, which is indicated by region 475. Curve 465 corresponding to the inauthentic battery only exhibits a single local maximum at between approximately 4.0 V and approximately 4.1 V.

The charge differential response of the battery 130 also provides a basis for estimating the relative condition of the battery 130. For example, while curves 455 and 460 each exhibit a local maximum in region 475, the height of the local maximum is smaller as compared to the local maximum seen in region 425 of FIG. 6A. By detecting the height of the local maximum that occurs between approximately 3.9 V and approximately 4.0 V for the battery 130 and comparing against specified charge differential responses for authentic batteries, the power management module 134 in some embodiments can estimate the relative condition of the battery 130 based on the charge differential response of the battery module 262.

The characteristic charge differentials exhibited by authentic and inauthentic batteries are explainable in part by the underlying electrochemistry of the battery 130. For example, rechargeable batteries may be manufactured using different materials for each of the anode, cathode and electrolyte. Nickel-cadmium (NiCd) batteries typically use a nickel (III) oxide-hydroxide cathode, a cadmium electrode, and an alkaline electrolyte, such as potassium hydroxide. Compared to NiCd batteries, nickel-metal hydride (NiMH) batteries typically use a different metallic compound for the anode, which can be a rare earth mixture.

More recently, rechargeable lithium ion batteries (LIB) have been developed, in which the migration of ions of lithium from the battery anode to the battery cathode during discharge provides the electromotive force of the battery. During charging, an external electrical power source (e.g., the charging circuit) applies a charging voltage to the battery of the same polarity as the battery terminals, but of a larger magnitude, which causes a process of reverse migration to occur. The ions of lithium collected at the cathode are forced back to the anode, wherein they become embedded in a process known as intercalation.

Because the intercalation of the lithium ions occurs more readily at certain discrete energy levels, the charge input rate of the battery 130 (i.e., the charge differential) varies throughout the charge cycle of the battery 130 in a manner that is characteristic to the internal electrochemistry of the battery 130. As suggested by FIGS. 6A and 6B, inauthentic batteries will not typically match the intercalation rates of authentic batteries. Even if the inauthentic battery is designed using the same or a similar internal electrochemical process, ion intercalation is affected by other factors such as the battery size and geometry.

While explained primarily with reference to the electrochemistry of lithium ion batteries, NiCd and NiMH batteries also utilize ion intercalation during charging to embed charge carriers in the battery anode. As a result, NiCd and NiMH batteries also tend to exhibit charge differential responses during charging that are characteristic of the underlying electrochemistry and battery topology. In each case, the particular charge differential response of the battery 130 may provide a basis for authenticating or estimating the relative condition of the battery 130, or both.

Figure 7:
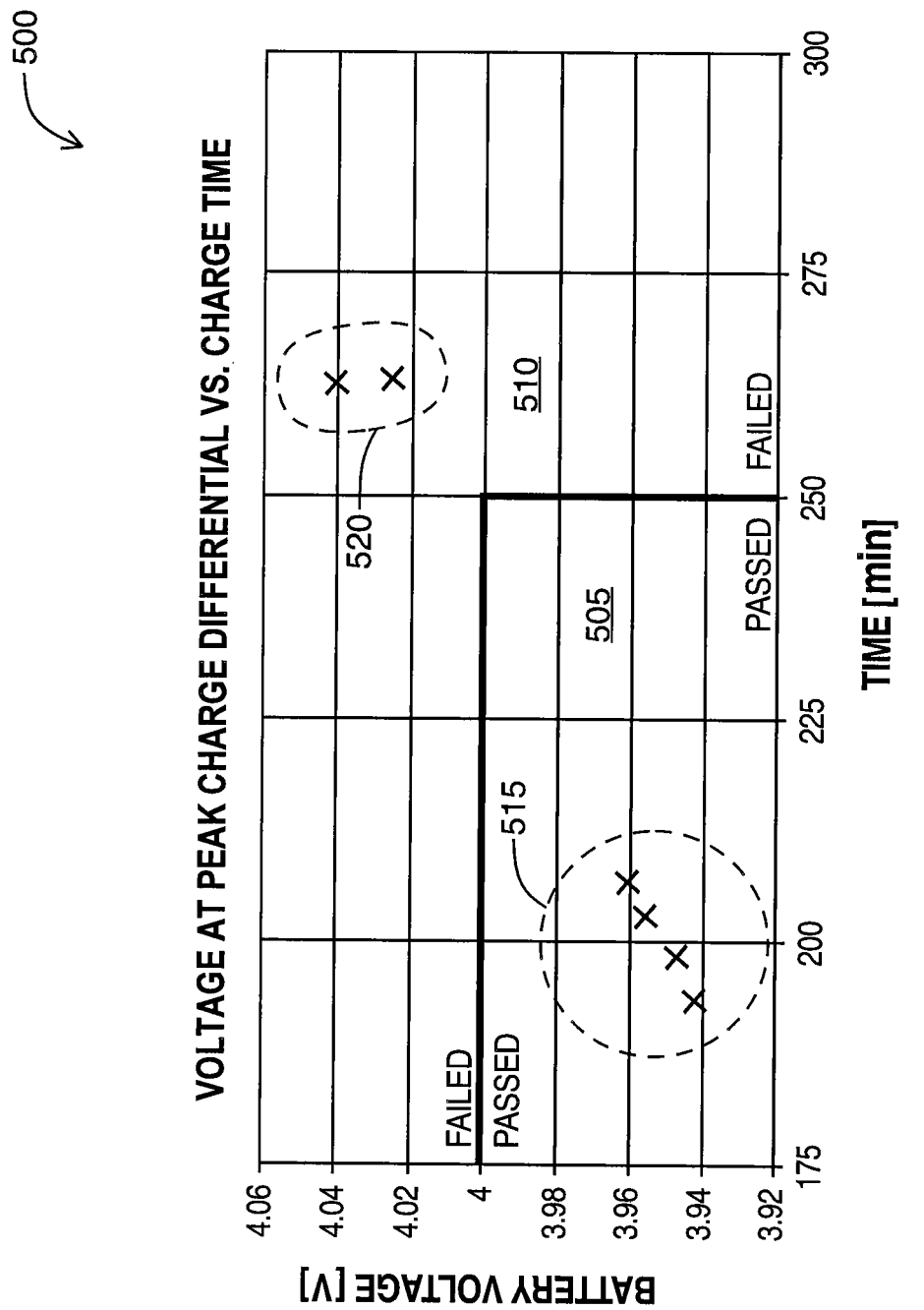
FIG. 7 is a graph showing a relationship between battery voltage at peak charge differential and charge time for both authentic and inauthentic batteries.
Figure 8:
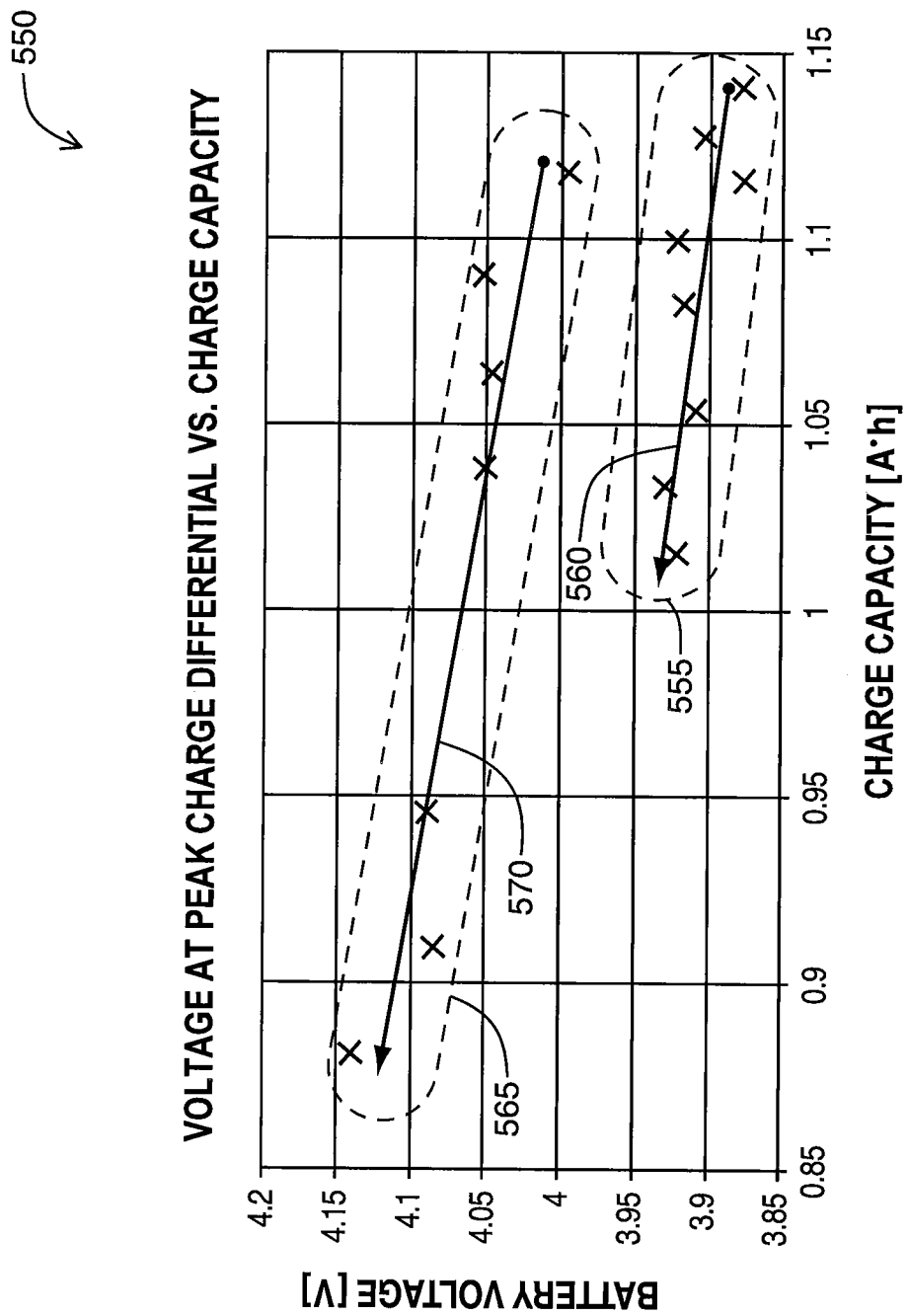
FIG. 8 is a graph showing a relationship between battery voltage at peak charge differential and charge capacity for both authentic and inauthentic batteries over the life cycle of the battery.

Referring now to FIGS. 7 and 8, the charge differential response of the battery 130 (FIG. 4) may be characterized by the power management module 134 in an alternative form to what is illustrated in FIGS. 6A and 6B.

Graph 500 in FIG. 7 plots voltage on the y-axis (in units of volts, V) against charge time on the x-axis (in units of minutes, min). The y-axis values in graph 500 represent measured terminal voltages of the battery module 262 (FIG. 4) at the point during charging of the battery 130 where the charge differential (as defined above with respect to FIGS. 6A and 6B) reaches its maximum value. The x-axis values in graph 500 represent the time during the charge cycle at which the maximum charge differential occurred. Accordingly, graph 500 is specific to a particular charging current (e.g., 1C) and could be equivalently drawn with units of Joules on the x-axis.

Region 505 on graph 500 is defined to include all points having a y-coordinate less than 4.0 V and an x-coordinate less than 250 min. Region 510 includes all points not included in region 505. In some embodiments, the power management module 134 may determine if the battery 130 is authentic according to whichever region, 505 or 510, the measured battery voltage at peak charge differential is located in. It should be appreciated that the specific boundaries illustrated in FIG. 7 are illustrative only and may have different values depending on the conditions under which the parameters of the battery 130 are measured.

Data points 515 are each located within region 505 and correspond to measurements taken on authentic batteries. For example, data points 515 can represent measurements taken on the same authentic battery or, alternatively, from different authentic batteries manufactured from different authorized sources. Data points 520 are each located within region 510 and correspond to measurements taken on inauthentic batteries. Again, for example, data points 520 can represent measurements taken on the same inauthentic battery or, alternatively, from different inauthentic batteries.

As will be appreciated from FIG. 7, data points 520 have generally different x-coordinates and y-coordinates relative to data points 515. This indicates that the peak charge differential for the inauthentic batteries occurred both at a different terminal voltage of the battery module 262 (~4.03 V as opposed to ~3.95 V) and at a different time during the charge cycle (~262.5 min as opposed to ~200 min). Each or both of these differences may be detected and used by the power management module 134 to authenticate the battery 130.

Referring now to FIG. 8 specifically, the charge differential response of authentic and inauthentic batteries is also characterizable or measurable over the lifetime of the battery 130 (FIG. 4). Graph 550 in FIG. 8 plots voltage on the y-axis (in units of volts, V) against charge capacity on the x-axis (in units of ampere-hours, A·h). For each data point plotted on graph 550, the y-axis value represents measured terminal voltages of the battery module 262 at the point during charging of the battery 130 where the charge differential (as defined above with respect to FIGS. 6A and 6B) reaches its maximum value. The corresponding x-axis value then represents the charge capacity of the battery 130 at which the maximum charge differential occurred and, accordingly, corresponds to a particular tap time during charging or discharging. Charge capacity may be estimated, for example, by integrating the charging current supplied to the battery 130 over time during the charge cycle.

Data points 555 correspond to measurements taken on an authentic battery at various intervals over the lifetime of an authentic battery. The authentic battery trendline 560 indicates the general trajectory of the data points 555 as the authentic battery ages, from right (new/fresh battery) to left (aged/cycled battery). As the authentic battery trendline 560 indicates, over the lifetime of the battery, peak charge differentials tend to occur at increasing terminal voltages and correspondingly decreasing charge capacities of the battery module 262.

Graph 550 also includes data points 565, which correspond to measurements taken on an inauthentic battery over the lifetime of the inauthentic battery, and under similar conditions as the data points 555 generated for the authentic battery. The general trajectory of data points 565 is indicated by inauthentic battery trendline 570, which shows that for the inauthentic battery, as well as the authentic battery, peak charge differential tends over the lifetime of the battery tends to drift toward increasing terminal voltages and correspondingly decreasing charge capacities of the battery module 262.

As FIG. 8 shows, the power management module 134 may authenticate the battery 130 as being from an authorized source using the measurement of peak charge differential. For example, power management module 134 (FIG. 4) may distinguish between data points on the two trendlines 560 and 570 to define reference peak charge differential values for authentic batteries. Measurements of peak charge differential for the battery 130 may then be compared against each of the authentic battery trendline 560 and the inauthentic battery trendline 570. If the power management module 130 determines that the peak charge differential measurement better matches the authentic battery trendline 560, the battery 130 may be authenticated. Otherwise, if the peak charge differential measurement better matches the inauthentic battery trendline 570, the power management module 134 may refuse to authenticate the battery 130 and, optionally, perform additional comparisons based on other electrical responses of the battery 130 to make a conclusive authentication.

In addition to performing authentication, power management module 134 may also estimate the relative condition of the battery 130 using the measurement of peak charge differential. The relative condition of the battery 130 may also be estimated without performing authentication, in variant embodiments. For example, power management module 134 may determine where on the authentic battery trendline 560 the measurement of peak charge different is located in order to estimate the relative condition of the battery 130. As the battery 130 ages, the measurement of peak charge differential will tend to move along the authentic battery trendline 560, from right to left, at a characteristic rate that provides one possible basis for estimating the relative condition of the battery 130.

While FIGS. 7 and 8 present some numerical examples, it should be appreciated that the particular data points plotted on graphs 500 and 550 are illustrative only and may depend on the particular conditions of the battery 130 when the measurements are taken. For example, temperature and charging/discharging rate will generally affect the measurement of peak charge differential. Accordingly, in some embodiments, different reference peak charge differentials may be determined for different external conditions of the battery 130, such as temperatures and charging/discharging rates, and stored in the power management module 134 for use in authenticating or estimating the relative condition of the battery 130, or both.

Voltage Slump

Figure 9A:
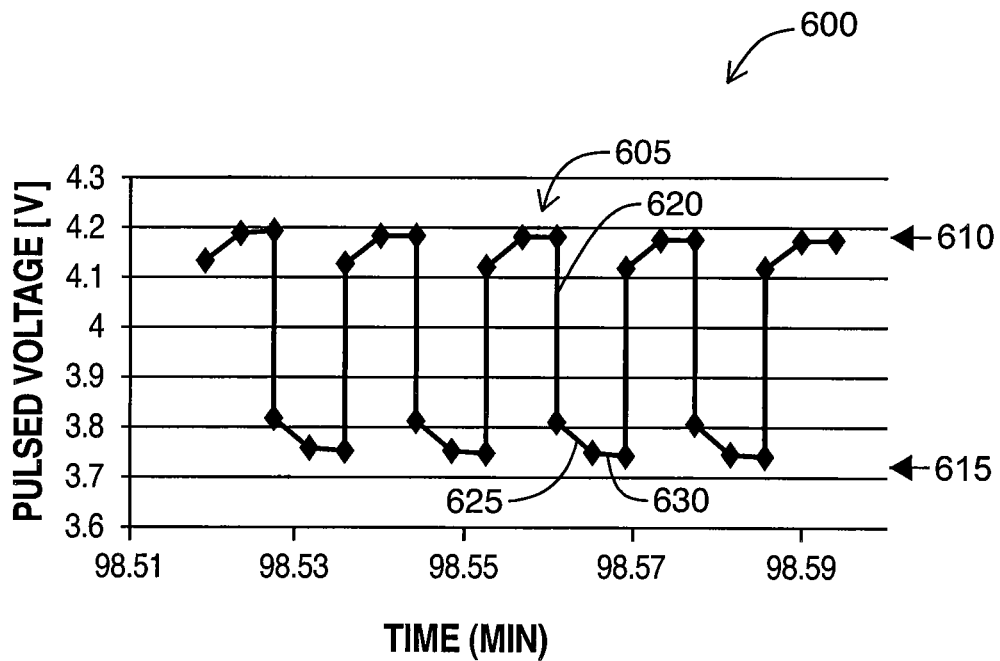
FIG. 9A is a graph showing a transient response of a fresh battery due to pulsed charging or discharging.
Figure 9B:
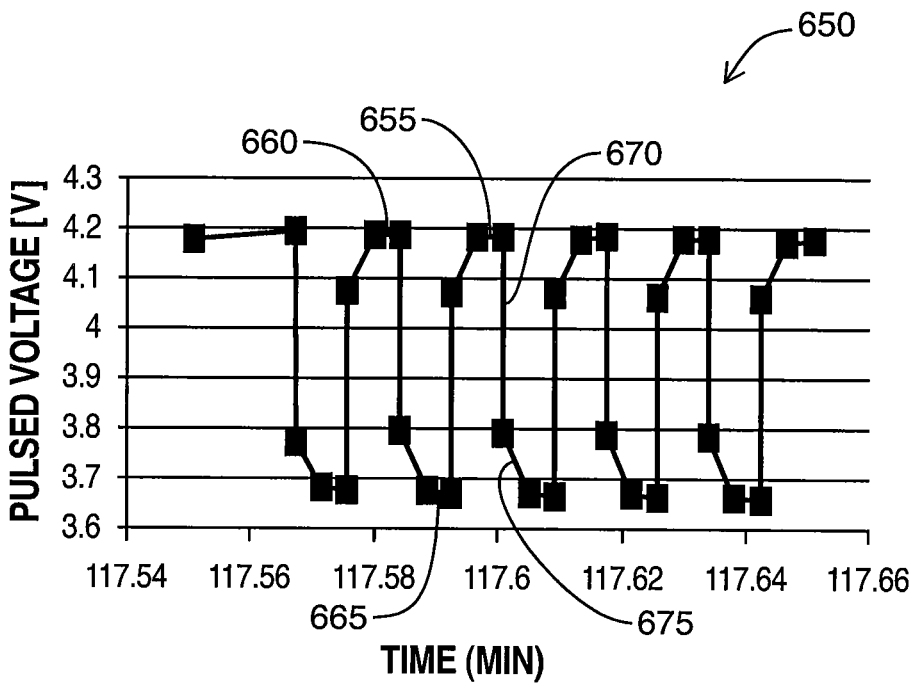
FIG. 9B is a graph showing a transient response of a heavily cycled battery due to pulsed charging or discharging.

Referring now to FIGS. 9A and 9B, a transient response of the battery 130 (FIG. 4) to alternating current may exhibit characteristic features that provide a basis for the power management module 134 (FIG. 4) to differentiate between authentic and inauthentic batteries. Graph 600 in FIG. 9A plots battery terminal voltage on the y-axis (in units of volts, V) against time on the x-axis (in units of minutes, min) for a new/fresh battery. Graph 650 in FIG. 9B plots battery terminal voltage on the y-axis (in units of volts, V) against time on the x-axis (in units of minutes, min) for an aged/cycled battery.

Curve 605 plotted on graph 600 represents the transient response of a new, authentic battery to a large intermittent (e.g., pulsed) current draw. For example, curve 605 may represent the current drawn from the battery 130 during transmission or receipt of wireless communications by the communication subsystem 104 (FIG. 1). Alternatively, curve 605 may represent an artificial current draw from the battery 130 requested by the power management module 134 after interrupting normal operation of the mobile device 100.

Each cycle in battery voltage curve 605 consists of a high voltage level 610 and a low voltage level 615. The high voltage level 610 results when no or little current is being drawn from the battery 130 and corresponds approximately to the open circuit voltage of the battery module 262. However, when a large current is drawn from the battery 130, the terminal voltage of the battery module 262 characteristically "droops" or "slumps" down to the low voltage level 615. When the large current draw on the battery 130 ceases, the battery voltage rebounds to the high voltage level 610.

As seen in FIG. 9A, each battery "droop" or "slump" may be considered to undergo a number of transitions that define at least three discrete phases. In phase 620, the battery voltage curve 605 undergoes a relatively steep decrease from the high voltage level 610 to an intermediate voltage level somewhat above the low voltage level 615. In the next phase 625, the battery voltage curve 605 undergoes a second, more gradual decrease from the intermediate level down to the low voltage level 615. In the final phase 630, the battery voltage curve 605 holds steady at the low voltage level 615 until the large current draw on the battery 130 is stopped and the battery voltage curve 605 then rebounds to the high voltage level 610. Similar discrete phases may be observed as the battery voltage curve 605 rebounds to the high voltage level 610.

The phases 620, 625 and 630 of the battery voltage curve 605 are explainable with reference to the internal electrochemistry of the battery 130. The relatively rapid decrease of the battery voltage curve 605 in phase 620 corresponds to the interval voltage drop in the battery module 262 due to the effective series resistance (ESR) of the battery module 262. The voltage difference between the high voltage level 610 and the intermediate voltage level, in relation to the battery current, therefore provides an estimate of the battery ESR. The second, more gradual voltage drop in phase 625 of the battery voltage curve 605 is due at least in part to one or more polarization layers building up inside the battery module 262 at one or more electrode/separator interfaces (explained below with reference to FIG. 10) when the battery 130 is being discharged.

Different internal battery electrochemistries give rise to different battery droop characteristics, not just between batteries manufactured from different sources or having different geometries, but also over the lifetime of the battery 130. Accordingly, the amounts of the two voltage drops caused respectively by the battery ESR and a polarization layer provide the power management module 134 with bases for comparison between authentic and inauthentic batteries. For example, the power management module 134 may measure one or both of these voltage drops and compare against reference voltage drops for authentic batteries. Matching of measured to reference values may allow the power management module 134 to authenticate the battery 130.

Additionally, the characteristic voltage drops caused respectively by the battery ESR and the polarization layer provide the power management module 134 with at least two bases for estimating the relative condition of the battery 130.

Referring now to FIG. 9B, battery voltage curve 655 represents the transient response of the same battery characterized by battery voltage curve 605 in FIG. 9A, but no longer new. For example, curve 655 may represent an aged or heavily cycled battery. While battery voltage curve 655 has the same general waveform as battery voltage curve 605, comprising alternating high and low voltage levels 660 and 665, the droop characteristics of battery voltage curve 665 have changed somewhat. In particular, the voltage drops experienced in phases 670 and 675 of battery voltage curve 655 are each respectively larger than corresponding voltage drops associated with phases 630 and 625 of battery voltage curve 605 determined for the new battery (shown in FIG. 9A).

To some extent, these differences can be explained by the decreased mobility of the charge carriers (e.g., the ions of lithium) inside the battery module 262 as the battery 130 ages. Decreased ion mobility tends to increase the ESR of the battery 130 and, due to the increased susceptibility of the battery electrolyte, cause a thicker polarization layer to form on the battery anode. Many aged or heavily cycled batteries will therefore exhibit larger ESR and thicker polarization layers over time.

In some embodiments, the power management module 134 measures one or both of the voltage drops due to ESR and polarization in order to characterize the transient response of the battery 130. By comparing the measured voltage drops with changing reference values over time, the power management module 134 is able to estimate the relative condition of the battery 130. While FIG. 9B shows the transient response of a heavily cycled battery, in relation to the transient response of a new battery shown in FIG. 9A, it should be appreciated that inauthentic batteries may also exhibit different droop characteristics as compared to authentic batteries. Thus, in some embodiments, power management module 134 also uses the characterized transient response of the battery 130 to perform authentication.

Electrochemical Impedance Spectroscopy (EIS)

Referring now to FIGS. 10, 11 and 12A-12D, battery impedance modeling and estimation performed under conditions of alternating current (AC), hereinafter referred to as "electrochemical impedance spectroscopy" (EIS), provides a further basis for differentiating between authentic and inauthentic batteries. Accordingly, in some embodiments, the power management module 134 performs (FIG. 4) EIS on the battery 130 to perform authentication.

In EIS, a network model is proposed to represent the AC impedance of different internal components or structures of a known authentic battery. Each internal battery component included in the network model is represented by a corresponding battery parameter. Specific relationships (e.g., series or parallel connections) are also defined between certain of the battery parameters included in the network model to reflect different physical relationships between the internal battery components represented in the network model. Values for the different battery parameters are then solved by measuring the total complex impedance of the authentic battery under different AC frequency excitations, and performing systems analysis on the network model to determine values for each individual battery parameter. After computing values for the different battery parameters, the complete network model of the authentic battery provides a measure of the reference impedance of authentic batteries for comparison against measured impedances of the battery 130.

As will be appreciated, impedance may be related to voltage through current. Accordingly, in some embodiments, as an alternative to comparing measured and reference impedances, the power management module 134 may be configured to measure terminal AC voltages of the battery module 262 for a given AC current, and compare the measured terminal AC voltages against reference terminal AC voltages derived from the reference impedance of the authentic battery and the given AC current.

Figure 10:
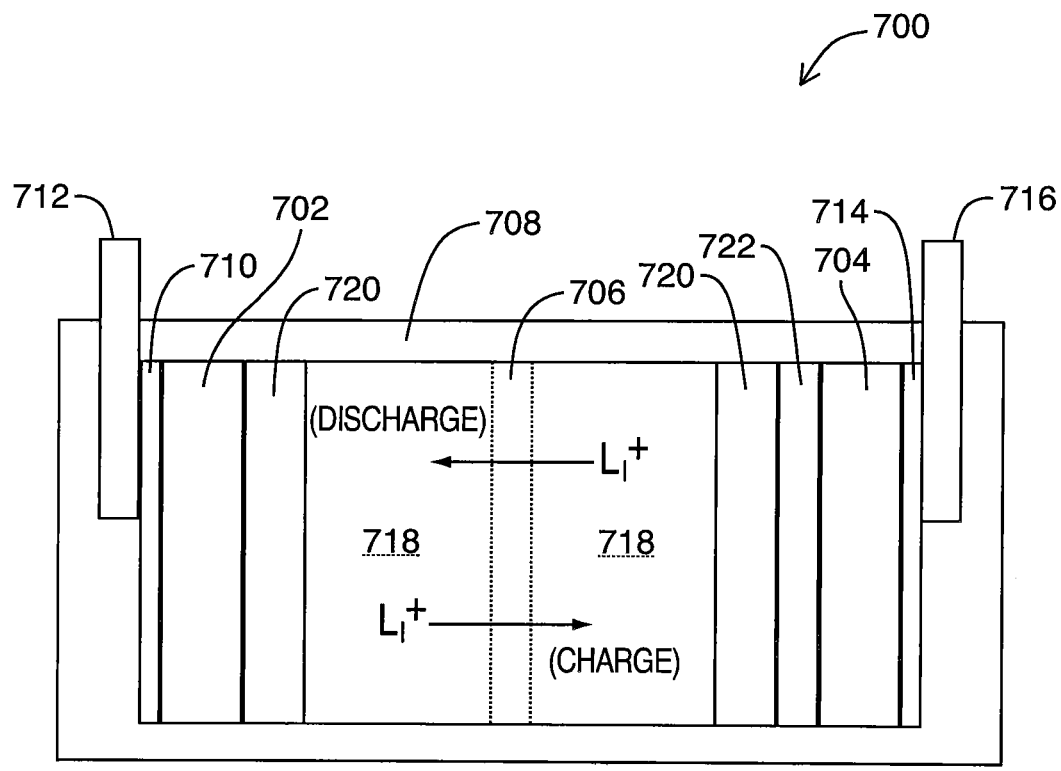
FIG. 10 is a schematic diagram illustrating the internal winding structure of a battery module included in the battery shown in FIG. 3.

Referring now to FIG. 10 specifically, there is shown a simplified model of a battery winding 700 that may be included in the battery module 262 (FIG. 4) in some embodiments. The battery winding 700 is shown schematically in cross-sectional view for simplicity and clarity of illustration, although it should be appreciated that in the described embodiments, the battery winding 700 may be rolled or stacked within the battery module 262 to provide increased density. The battery module 262 may also include more than one battery winding 700 in different embodiments.

Battery winding 700 includes a cathode 702 separated from an anode 704 by a separator 706 inside of a housing 708. As noted above, the cathode 702 and anode 704 may be made from different materials depending on the electrochemistry of the battery 130. Current collector 710 backs the cathode 702 and provides an electrical path to tab 712, which leads to the exterior of the housing 708 and is thereby used as an external connection for the battery winding 700. Similarly, current collector 714 backs the anode 704 and provides an electrical path to tab 716, which leads to the exterior of the housing 708 and is thereby used as another external connection for the battery winding 700. The tabs 712 and 716 may also together form the external battery terminals for the battery module 262.

An electrolyte is provided in the interior space 718 within the housing 708, between the cathode 702 and the anode 704. The electrolyte, which may be in a liquid or solid phase, contains the charge carriers that provide the battery winding 700 with an electromotive force (EMF) when charged. For example, in lithium-ion batteries, the electrolyte is a liquid containing salts of lithium that oxidize to produce lithium ions. The separator 706 divides the interior space 718 into two parts, but is permeable to the charge carriers, e.g. $Li^+$ ions. As the arrows in FIG. 10 indicate, the $Li^+$ ions pass through the separator 706 from anode 704 to cathode 702 during discharge and from cathode 702 to anode 704 during charging of the battery 130.

A polarization layer 720 forms on each of the cathode 702 and anode 704 due to charge separation and the internal EMF of the battery winding 700. The thickness of the polarization layers 720 may depend on the geometry and relative condition of the battery 130, as well as on the temperature and discharge rate of the battery 130.

For lithium-ion batteries, a solid electrolyte interphase (SEI) layer 722 also forms on the interior surface of the anode 704 between the anode 704 and the associated polarization layer 720. During charging of the battery winding 700, some of the electrolyte decomposes on the anode 704 and forms the SEI layer 722. While acting as a partial electrical insulator, the SEI layer 722 still provides overall ionic conductivity between the electrolyte and the anode 704. The thickness of the SEI layer 722 also depends on the geometry and relative condition of the battery 130. As will be explained, the SEI layer 722 and the other components of the battery winding 130 collaborate to provide the battery winding 130 with a characteristic AC impedance response.

Figure 11:
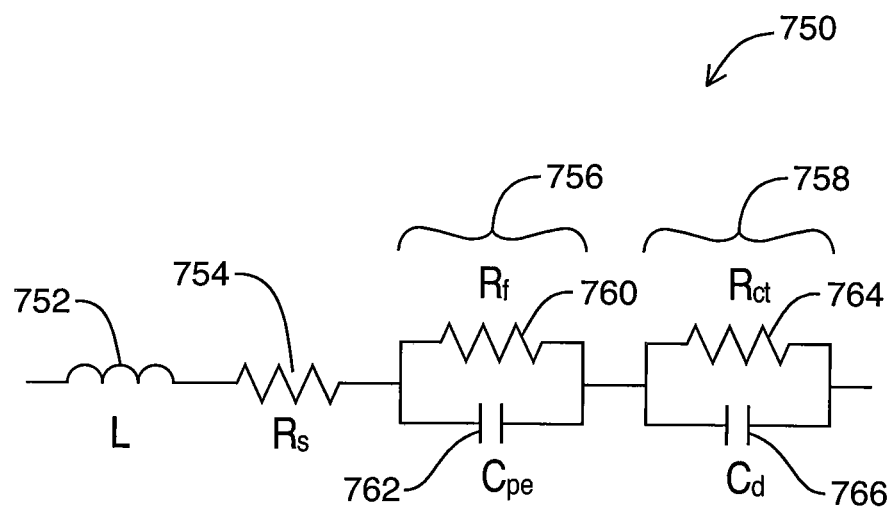
FIG. 11 is a network model for the internal winding structure of the battery module shown in FIG. 10.

Referring now to FIG. 11 specifically, there is shown a network model 750 used to model the impedance characteristic of the battery winding 700 shown in FIG. 10. The network model 750 includes a series combination of an inductor (L) 752, a resistor ($R_s$) 754, and two RC elements 756 and 758. The first RC element 756 includes a parallel combination of a resistor ($R_f$) 760 and a capacitor ($C_{pe}$) 762. The second RC element 758 includes a parallel combination of a resistor ($R_{ct}$) 764 and a capacitor ($C_d$) 766.

Each of the battery parameters included in the network model 750 represents the electrical characteristic of one or more physical components of the battery winding 700 shown in FIG. 10. It should be appreciated that the complexity of the network model 750 may be varied by taking into account the electrical characteristics of a greater or a fewer number of physical components of the battery winding 700. The network model 750 is also shown as a linear system in this example embodiment, but could also be modified to include some non-linear components to provide a closer approximation of the electrical characteristics of the battery winding physical components.

As shown in FIG. 11, inductor 752 models the net inductance of the battery winding 700 and external wire and other electronic connections. The inductance of these components may be small or negligible and, consequently, in some embodiments the inductor 752 may be omitted from the network model 750. Resistor ($R_s$) 754 models the combined series resistance of the cathode 702, separator 706, anode 704 and electrolyte in the direction of ionic flow within the battery winding 700. The RC networks 756 and 758 account for other charge dependent effects in the battery winding 700.

The RC network 756 accounts for the electrical characteristic of the SEI layer 722. More specifically, resistor ($R_f$) 760 and capacitor ($C_{pe}$) 762 model the resistance and capacitance, respectively, of the SEI layer 722. In a similar fashion, the RC network 758 corresponds to and accounts for electrical characteristics of the double polarization layer 720. Capacitor ($C_d$) 766 represents the combined capacitance across the two polarization layers 720, i.e. between the electrolyte and each of the cathode 702 and anode 704. Resistor ($R_{ct}$) 764 models the resistance associated with the transfer of charge carriers between the electrolyte and one of the cathode 702 and anode 704, through a corresponding one of the polarization layers 720.

The power management module 134, for example, solves values for each of the battery parameters included in the network model 750, e.g. using system analysis, to generate the reference impedance response for authentic batteries over a broad range of frequencies. The reference impedance response is stored in the power management module 134 for comparison against a characterized impedance response of the battery winding 700, which the power management module 134 may determine by measuring the impedance of the battery winding 700 at different AC excitation frequencies.

Figure 12A:
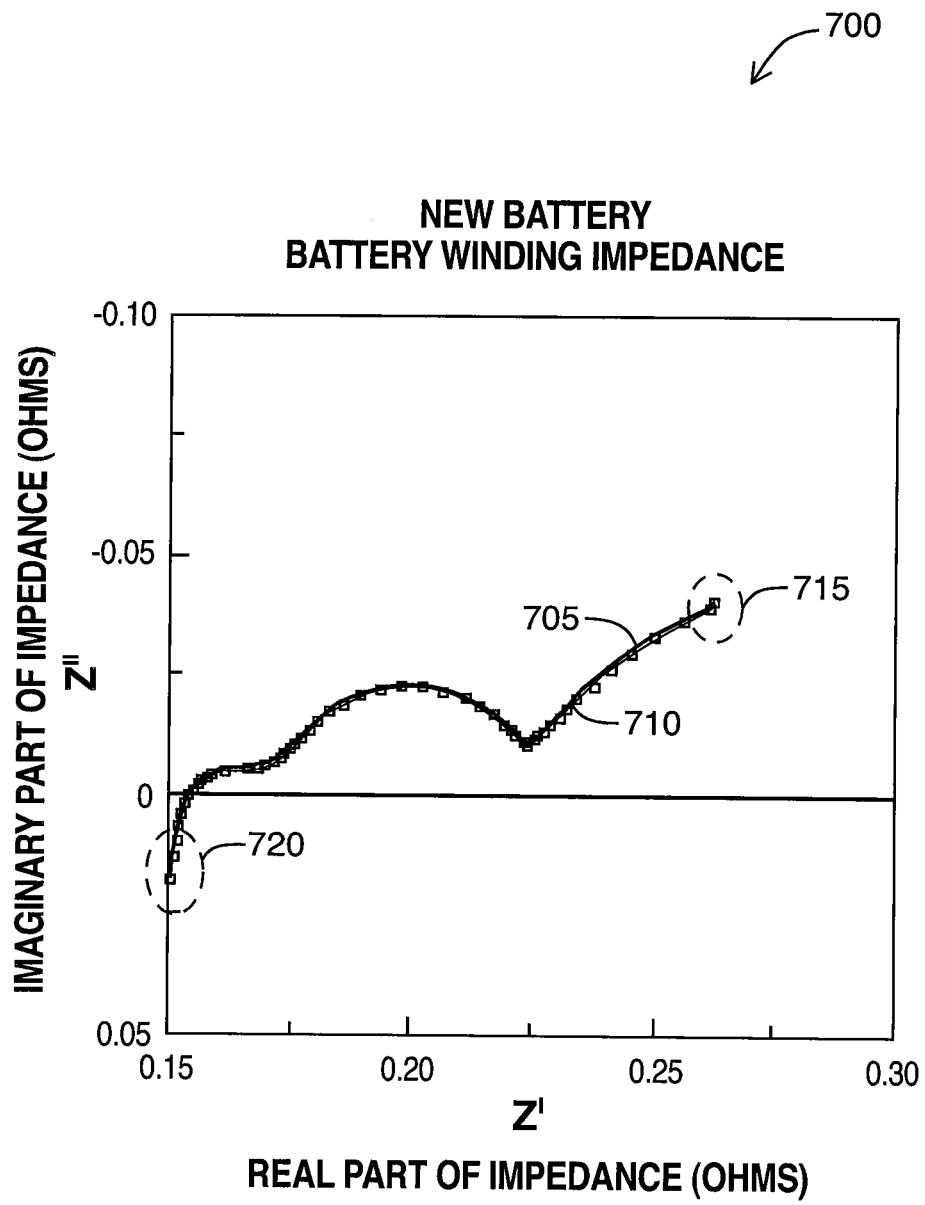
FIG. 12A is a graph plotting the real and imaginary components of battery impedance for a new battery at different frequencies.
Figure 12B:
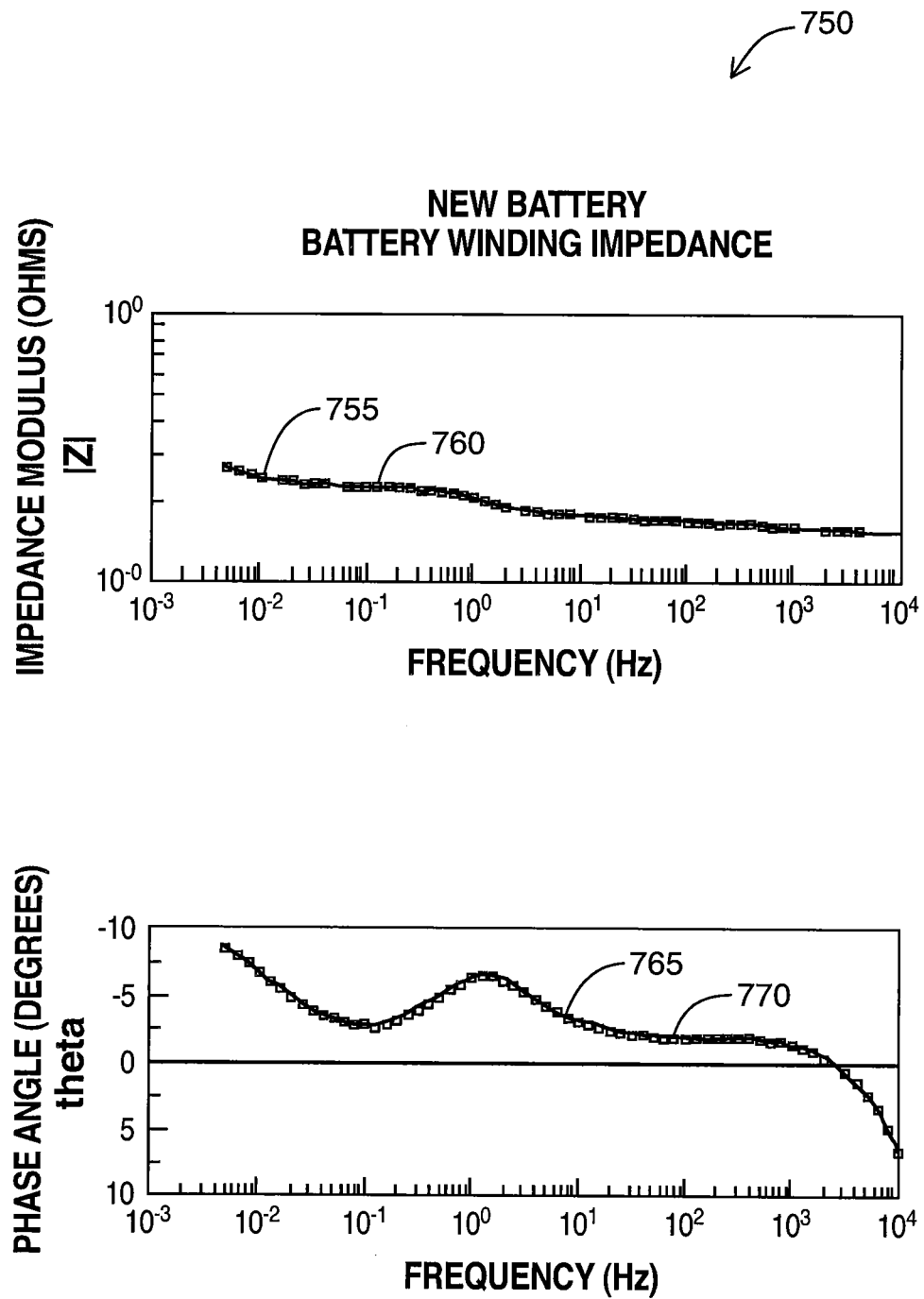
FIG. 12B is a graph plotting the magnitude and phase of battery impedance as a function of frequency for a new battery.

Referring now to FIGS. 12A and 12B specifically, the characterized and reference impedances of a new, authentic battery are illustrated. Graph 700 in FIG. 12A plots the real and imaginary parts of the battery winding impedance for different excitation frequencies. Curve 705 represents the reference impedance for authentic batteries and curve 710 represents the characterized impedance of the battery 130. The excitation frequencies increase from region 715 (<approximately 1 Hz) toward region 720 (>approximately 10 kHz).

Graph 750 in FIG. 12B plots the same data as FIG. 12A, but with the magnitude and phase of the battery winding impedance explicitly as a function of excitation frequency. Accordingly, curve 755 represents the reference impedance magnitude for authentic batteries and curve 760 represents the characterized impedance magnitude of the battery 130, each explicitly as functions of excitation frequency. Likewise, curve 765 represents the reference impedance phase for authentic batteries and curve 770 represents the characterized impedance phase of the battery 130 as functions of excitation frequency.

As FIGS. 12A and 12B confirm, the solved network model 750 may be used to predict the impedance of the battery 130 under AC excitation over a broad range of frequencies. Thus, by measuring the impedance of the battery 130 over a sufficient number of different excitation frequencies and comparing against reference values, in some embodiments, the power management module 134 may authenticate the battery 130 in terms of its characteristic impedance response.

Additionally, the characteristic AC impedance of the battery winding 700 provides the power management module 134 with a basis for estimating the relative condition of the battery 130.

Figure 12C:
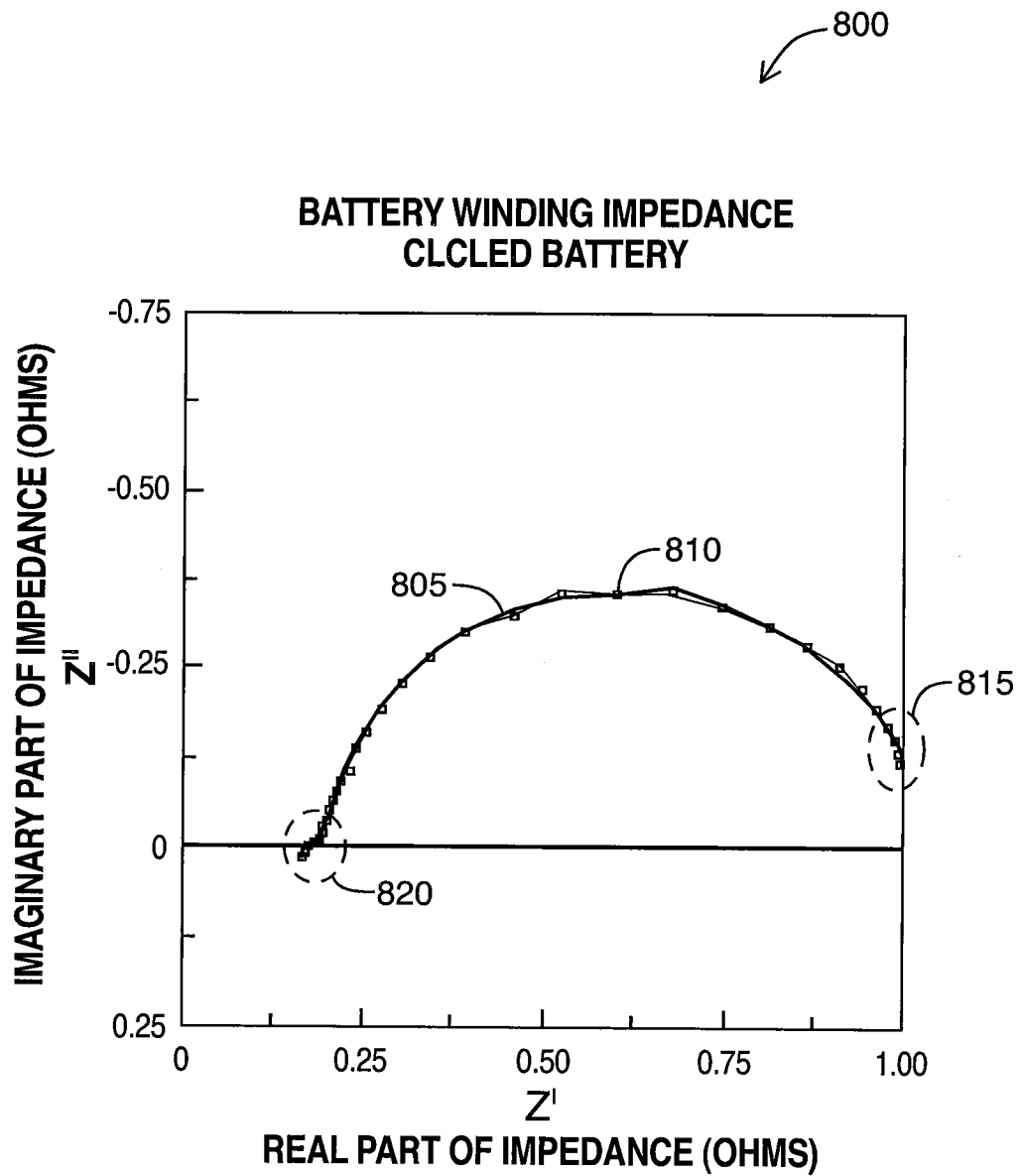
FIG. 12C is a graph plotting the real and imaginary components of battery impedance for a heavily cycled battery at different frequencies.
Figure 12D:
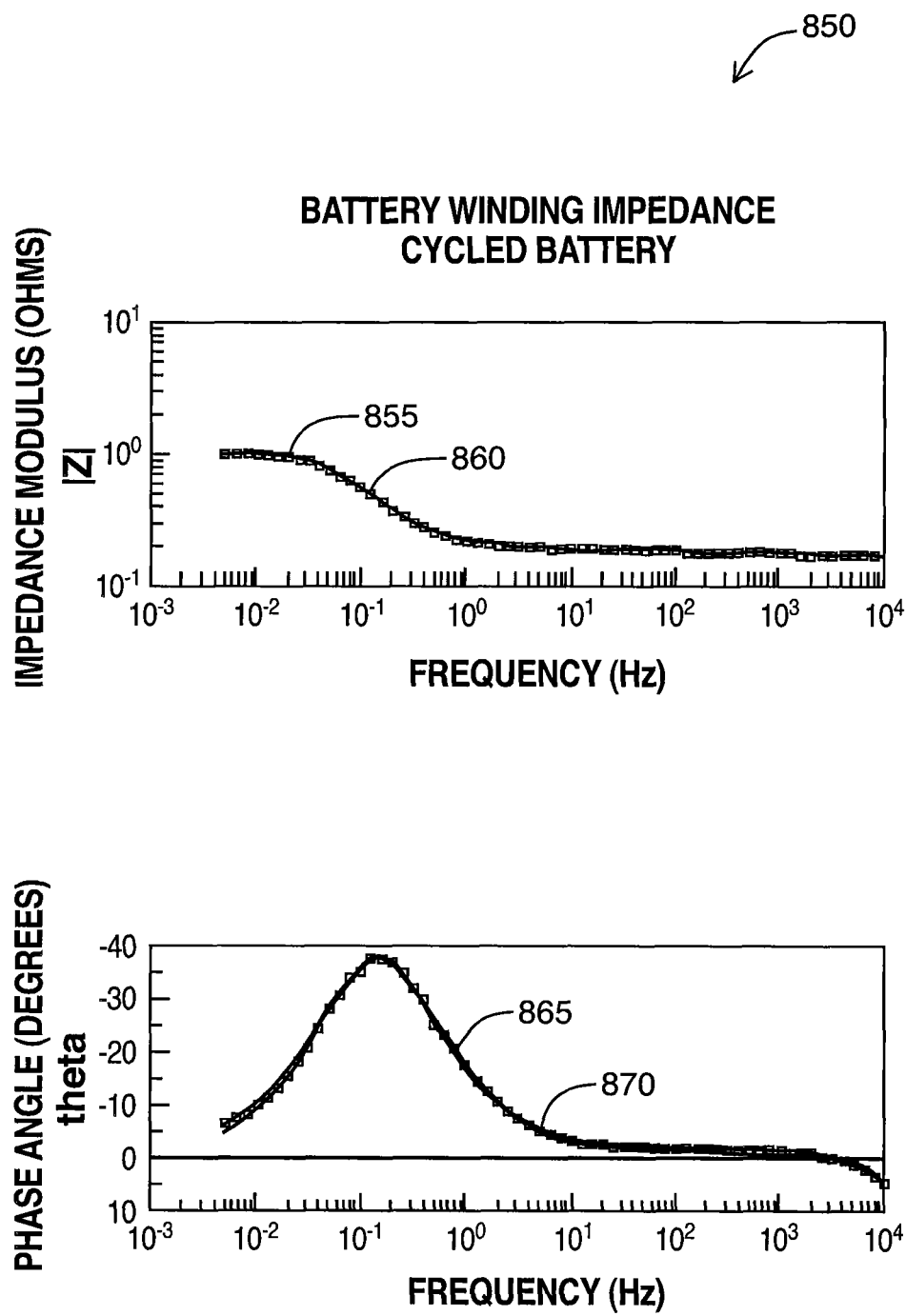
FIG. 12D is a graph plotting the magnitude and phase of battery impedance as a function of frequency for a heavily cycled battery.

Referring now to FIGS. 12C and 12D, the reference and characterized impedance responses for a heavily cycled battery are shown. Graphs 800 and 850 in FIGS. 12C and 12D plot characterized and reference impedance data under the same conditions as that of the authentic battery plotted in FIGS. 12A and 12B, but after the battery has been heavily cycled.

In graph 800, curve 805 represents the reference impedance for heavily cycled, authentic batteries, while curve 810 represents the characterized impedance of the battery 130 after heavy cycling. The excitation frequencies again increase from region 815 (<approximately 1 Hz) toward region 820 (>approximately 10 kHz). Likewise in graph 850, the same data is presented explicitly in terms of the magnitude and phase of the battery winding impedance as a function of excitation frequency. In particular, curve 855 represents the reference impedance magnitude for heavily cycled authentic batteries and curve 860 represents the characterized impedance magnitude of the battery 130 after heavy cycling frequency. Also, curve 865 represents the reference impedance phase for heavily cycled authentic batteries and curve 870 represents the characterized impedance phase of the battery 130 after heavy cycling.

As seen from FIGS. 12C and 12D, the impedance of the battery winding 700 changes as the battery 130 ages. Accordingly, to estimate the relative condition of the battery 130, the impedance response of authentic batteries at different ages or states of health may be specified and stored in the power management module 134. To estimate the relative condition of the battery 130, the characterized impedance response of the battery 130 is then compared against and matched to one of the specified reference responses for authentic batteries. The location of the characterized impedance on the curve of reference impedances may be correlated by the power management module 134 with a certain age or state of health.

While not explicitly shown, if the characterized impedance response of the battery 130 does not correspond to one of the specified impedance responses for authentic batteries, the battery 130 will not be authenticated. Alternatively, the power management module 134 will compare a different characterized response of the battery 130 to reference values before determining that the battery 130 is or is not authentic.

Electromagnetic Radiation (EMR)

Figure 13B:
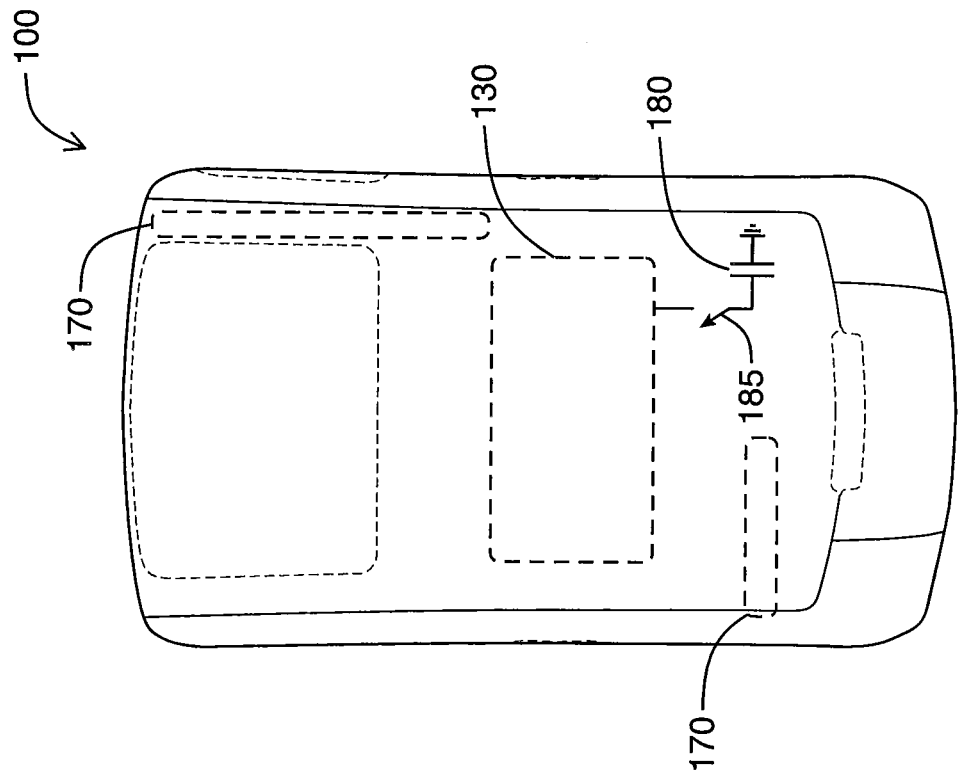
FIG. 13B is a rear perspective view of the example embodiment of the mobile device shown in FIG. 1 with the mobile device battery and several antennas indicated.
Figure 13A:
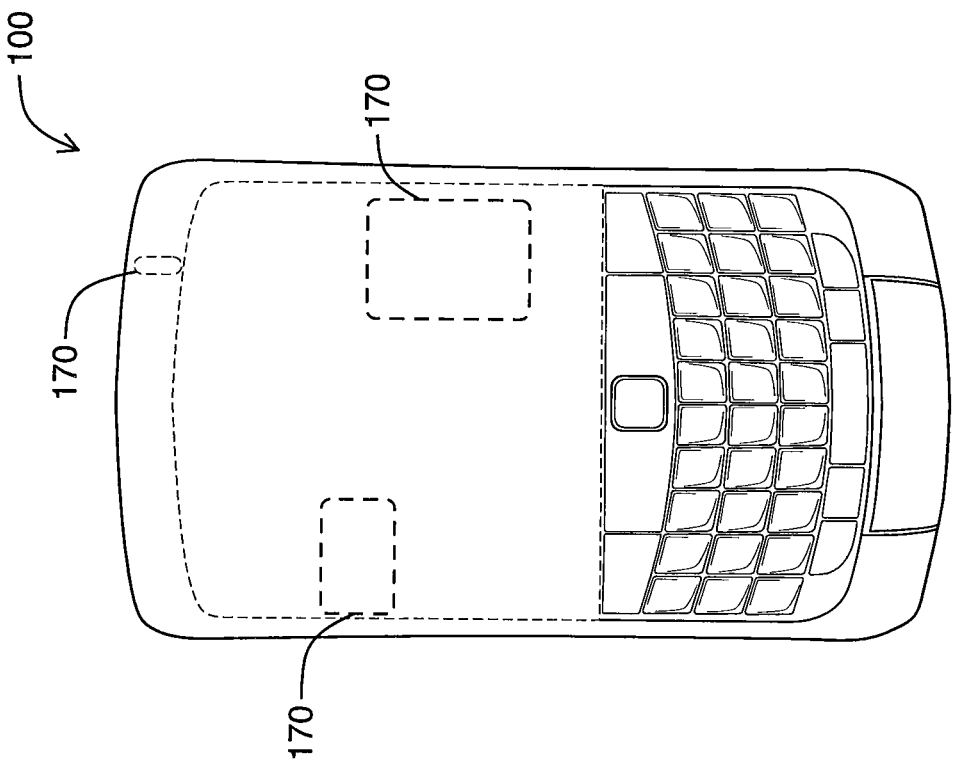
FIG. 13A is a front perspective view of an example embodiment of the mobile device shown in FIG. 1 with several antennas indicated.

Referring now to FIGS. 13A and 13B, the spectrum of electromagnetic radiation (EMR) emitted from the battery 130 (FIG. 4) during operation provides the power management module 134 (FIG. 4) with still another basis for comparison between authentic and inauthentic batteries. In some embodiments, the battery 130 is formed by folding or rolling one or more of the battery windings 700 shown in FIG. 10 into a more compact three-dimensional shape, typically a rectangular prism or cuboid. The folded or rolled trajectory of the battery windings 100 turns the battery 130 into a pseudo antenna, so that battery current flowing through the battery windings 700 causes radiation of electromagnetic energy that is generally detectable by nearby receiving antennas 170 on the mobile device 100.

The physical geometry of the battery 130 will generally affect the spectrum of EMR emitted from the battery 130. For example, the length of the battery windings 700 will affect the resonant frequency of the pseudo antenna provided by the battery 130. As will be appreciated, the signal power of an antenna will be maximized when the antenna is driven at the resonant frequency, but will decrease toward zero as the signal drive frequency is shifted away from the antenna resonant frequency. Depending on the resonant frequency of the battery windings 700, the battery 130 will emit EMR over a range of frequencies centered on the resonant frequency.

In some embodiments, a capacitor 180 is connectable to the battery 130 by a controlled switch 185, for example, so that the resonant frequency of the battery 130 can be shifted between a natural resonant frequency and an adjusted resonant frequency. The power management module 134, or alternatively the main processor 102 (FIG. 1), may control the switch 185 to selectively connect or disconnect the capacitor 180 to the battery winding 700.

As another example, most practical antennas have a certain radiation pattern comprising one or more "lobes" in which signal strength is comparatively larger than at other angles. Thus, the signal emitted in one direction will not necessarily have equal strength to the signal emitted in a different direction. The direction of folding or rolling of the battery windings 700 can, in some cases, also affect the directivity of the EMR emitted from the battery 130.

As illustrated by FIGS. 13A and 13B, in some embodiments, the mobile device 100 includes a plurality of receiving antennas 170 of various shapes and sizes and at generally different physical locations on the mobile device 100. For example, some of the antennas 170 may be included in the communication subsystem 104 illustrated in FIG. 2 and used for communicating with a long-range wireless network. Other of the antennas 170 may be part of the short-range communications subsystem 122 (FIG. 1) and used for communicating with other mobile devices over a short-range wireless network. The antennas 170 may be designed or tuned to detect signals in different frequency ranges depending on the particular purpose of the given antenna 170. For illustrative purposes, the antennas 170 are shown in FIGS. 13A and 13B as loops of generally different sizes to reflect this possibility.

Depending on the resonant frequencies of the battery winding 700 and the antennas 170, EMR emitted from the battery 130 at certain frequencies will be detectable in the antennas 170 with corresponding reference signal strengths relative to the signal power of the emitted EMR. The directivity and spatial orientation of the battery winding 700 in relation to the each respective antenna 170 will also generally affect the received signal strength of the EMR detected at each antenna 170. The capacitor 180 may be connected to the battery winding 700 in order to shift the resonant frequency of the battery winding 700 to a level that better matches the antennas 170 and causes the EMR emitted from the battery winding 700 to be detectable by a greater number of the antennas 170.

Because inauthentic batteries will have a generally different internal electrochemistry and physical structure as compared to authentic batteries manufactured from authorized sources, the spectrum of EMR emitted from authentic batteries will generally differ from that of inauthentic batteries. The EMR emitted from an inauthentic battery will therefore not be detected by the same antennas 170 with the same approximate received signal strength, as compared to authentic batteries.

In some embodiments, the power management module 134 measures the EMR spectrum of the battery 130 based upon the signal strength of the EMR received at each of the antenna 170. For this purpose, the power management module 134 may drive the battery winding 170 with a current of a selected frequency near the resonant frequency of the battery winding 700, and then measure or otherwise determine the strength of the signals received at each of the antennas 170. The power management module 134 then compares the received signal strengths against reference values that have been specified for authentic batteries and stored in the power management module 134.

The power management module 134 may drive the battery winding 700 at different frequencies and determine the corresponding strengths of the signals received at each of the antennas 170 at the different frequencies. Because each of the antennas 170 is sensitive to a different frequency range, the received signal strengths should generally differ between the two excitation frequencies. The power management module 134 may authenticate the battery by driving the battery winding 700 at a specific number of different excitation frequencies, and comparing measured signal strengths against reference values. If a specified subset of the received signal strengths match with reference values, the battery 130 is authenticated.

The spectrum of electromagnetic radiation emitted by the battery winding 130 also allows the power management module 134 to estimate the relative condition of the battery 130. As illustrated above in FIGS. 12C and 12D, the effective impedance of the battery 130 drifts as the battery 130 is aged. The changing impedance of the battery 130 also causes a corresponding drift in the resonant frequency of the battery winding 130. Accordingly, the spectrum of EMR emitted from the battery winding 700 also changes characteristically as the battery 130 ages.

In some embodiments, the spectrum of EMR emitted by authentic batteries at different intervals in the life cycle of the battery 130 is determined and stored in the power management module 134. By matching the characterized EMR spectrum of the battery 130 to one of the determined EMR spectrums corresponding to reference values for authentic batteries of different ages, the power management module 134 may also estimate the relative condition of the battery 130. The relative condition of the battery 130 may be estimated with or without authenticating the battery 130 as described above.

Figure 14:
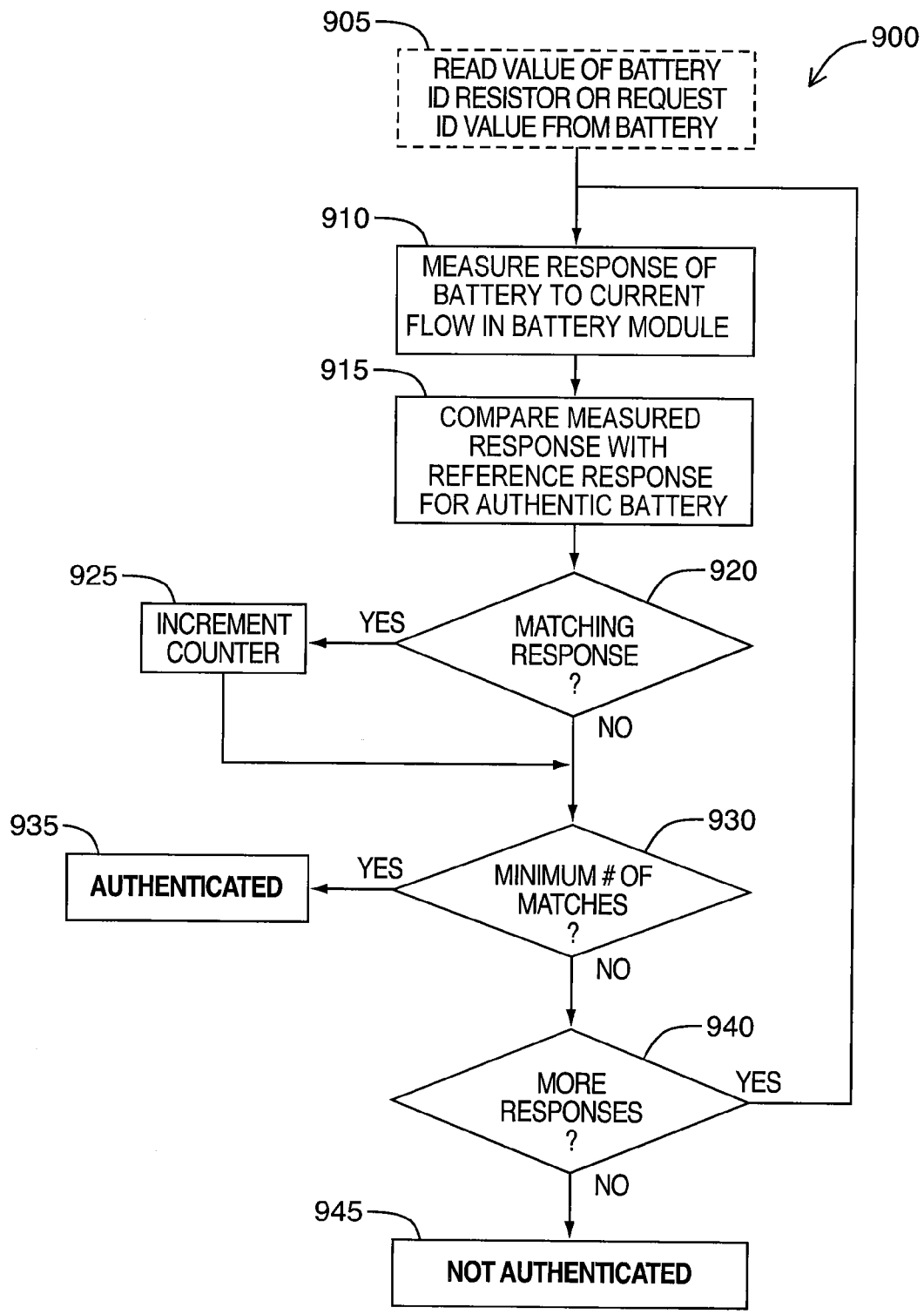
FIG. 14 is a flow chart illustrating a method of authenticating a battery in accordance with at least one embodiment.

Referring now to FIG. 14, there is illustrated a method 900 for authenticating a battery, such as battery 130 (FIG. 4), for use with a mobile communication device or other electronic device. The method 900 may be performed by various components of the mobile device 100 (FIG. 1), including the main processor 102 or the power management module 134 shown in FIG. 4. Accordingly, the following description of method 900 may be abbreviated for clarity. Further details of method 900 are provided above with reference to various figures described previously.

At 905, optionally, a battery ID resistor included in the battery 130 is read to identify a type of the battery 130. Alternatively, if the battery 130 includes an embedded processer, a battery ID value may be requested from the embedded processor at 905 to identify the type of the battery 130. In some embodiments, a cryptographic authentication of the battery 130 may also be performed at 905.

Due to the existence of third-party unauthorized or counterfeit batteries, the identification or authentication of the battery 130 performed at 905 through one or more of the above-described acts may not always be reliable. For example, it may be possible to intercept the battery ID value or some piece of cryptographic data used for authentication of the battery 130, thereby making false identification or authentication possible. To enhance battery authentication and security, battery physical and electrical parameters may be used diagnostically in various subsequent acts of method 900 to differentiate between authentic and inauthentic batteries without (or in addition to) the use of cryptographic data or other previous authentication techniques.

At 910, an electrical or electromagnetic response of the battery 130 due to current flow in one or more windings or cells of a battery module is characterized or otherwise measured. To characterize the electrical or electromagnetic response of the battery 130, one or more different battery quantities may be measured, such as the terminal voltage or current of the battery module. In some embodiments, the voltage and current measurements may be processed to calculate one or more derivative quantities used to characterize the electrical or electromagnetic response of the battery 130.

Without limitation, the measured electrical or electromagnetic response of the battery 130 may include any combination or one or more of the following: charge capacity (FIGS. 5A and 5B), charge differential (FIGS. 6A, 6B, 7, 8), voltage slump (FIGS. 9A and 9B), electrochemical impedance spectroscopy (FIGS. 10, 11, 12-12D), and electromagnetic radiation (FIGS. 13A and 13B). Further specific details of each type of electrical or electromagnetic response are provided above with reference to the figures noted respectively in parentheses.

At 915, the measured electrical or electromagnetic response is compared with a reference electrical or electromagnetic response for authentic batteries. The reference electrical or electromagnetic response may be specified and stored in the power management module 134, or alternatively the main processor 102, for comparison with the measured electrical or electromagnetic response. Each specified reference response may be specific to a set of external conditions to which the battery 130 may be subject, such as temperature and charge/discharge rate.

A corresponding reference response may also be specified and stored for each of a plurality of different sets of conditions. The reference electrical or electromagnetic response compared against the characterized response may be the one specified for conditions most closely correlating to measured conditions of the battery 130. In some embodiments, a temperature sensor may be used to detect the current temperature of the battery 130 in order to selecting the appropriate reference response for comparison with the characterized response.

In some embodiments, the optionally read battery ID resistor or optionally obtained battery ID value is also used at 915 to select one of the reference electrical or electromagnetic responses that were specified for authentic batteries. For example, reference electrical or electromagnetic responses specified for batteries of the same type of model as indicated by the battery ID resistor or ID value may be selected.

At 920, it is determined whether or not the characterized electrical or electromagnetic response of the battery 130 matches the reference electrical or electromagnetic response. To make this determination, a range or other criterion of matching may be defined. If it is determined that the characterized and reference electrical or electromagnetic responses do not match, the flow of method acts proceeds to 930.

On the other hand, if it is determined at 920 that the characterized and reference electrical responses match, the flow of method acts proceeds to 925, in which a counter used to track the number of successful matches is incremented. Alternatively, some other suitable approach for keeping track of the number of successful matches may be used at 925. The method then proceeds to 930.

At 930, it is determined whether a threshold minimum number of characterized electrical or electromagnetic responses have matched with corresponding reference responses. The threshold minimum number may be variable, and may be based on the desired robustness and accuracy of the method 900 and on the number of different types of electrical or electromagnetic responses characterized. In some embodiments, authentication may be based on the matching of a single characterized electrical or electromagnetic response, for example selected from any of the above-noted types. The threshold minimum number of matches for successful authentication would then be one.

By way of a further example, two or more different types of electrical or electromagnetic responses may be tested before the battery 130 will be authenticated, which may then be based on successfully matching some minimum subset of the different characterized electrical or electromagnetic responses. In some embodiments, each of the above-noted types of electrical or electromagnetic responses of the battery 130 may be characterized, with authentication of the battery 130 requiring one or more or all of the characterized electrical or electromagnetic responses to be successfully matched with corresponding reference electrical or electromagnetic responses.

If at 930, it is determined that the minimum number of electrical or electromagnetic response characterized for the battery 130 has been successfully matched with corresponding reference responses, the flow of method acts proceeds to 935 where the battery 130 is authenticated.

However, if it is determined that fewer than the minimum number of electrical or electromagnetic responses characterized for the battery 130 have been successfully matched with corresponding reference responses, the flow of method acts proceeds to 940 where it is determined if additional responses remain to be characterized.

If it is determined at 940 that no more electrical or electromagnetic responses of the battery 130 remain to be characterized (and fewer than the minimum number of characterized electrical or electromagnetic responses have been matched at 930), the flow of method acts proceeds to 945 where the battery 130 is not authenticated. Should the battery 130 not be authenticated, the main processor 102 may then initiate one or more defined protocols or sequences, which may include providing feedback to the user, controlling radio access in the mobile device 100, preventing the mobile device from operating or, for example, preventing the battery 130 from charging.

However, if it is determined at 940 that additional electrical or electromagnetic responses of the battery 130 remain to be characterized, the flow of method acts proceeds back to 910. The loop defined by 910 through 940 may be repeated until either it is determined at 930 that the minimum number of characterized electrical or electromagnetic responses has been matched (resulting in authentication of the battery 130) or it is determined at 940 that no more electrical or electromagnetic responses of the battery 130 remain to be characterized (resulting in non-authentication of the battery 130).

Although not explicitly shown in FIG. 14, in addition or as an alternative to performing authentication, and with suitable modification, the method 900 may be adapted to estimate a relative condition of the battery 130 (e.g. an age or state of health). For example, at 915, the characterized electrical or electromagnetic response of the battery 130 may be compared against one or more different reference electrical or electromagnetic responses for batteries of the same type as battery 130 specified for different points in the lifetime of the battery 130. By determining which one of the reference electrical or electromagnetic responses most closely matches the characterized response, the relative condition of the battery 130 may be estimated (e.g. according to the relative condition associated with the matched reference response). Optionally, the estimate of the relative condition may also be displayed to a user of the mobile device 100 on a display, such as display 110 (FIG. 1), so that the user may take suitable action.

Similar to authentication, an estimate of the relative condition of the battery 130 may also be determined by comparing one or more different types of electrical or electromagnetic responses. Accordingly, 920 through 940 may be unchanged for estimating the relative condition of the battery 130. Of course, 935 would then correspond to successful estimation of the relative condition, while 945 would correspond to unsuccessful estimation of the relative condition, for example because the characterized electrical or electromagnetic responses were too inconsistent for successful estimation.

Figure 15:
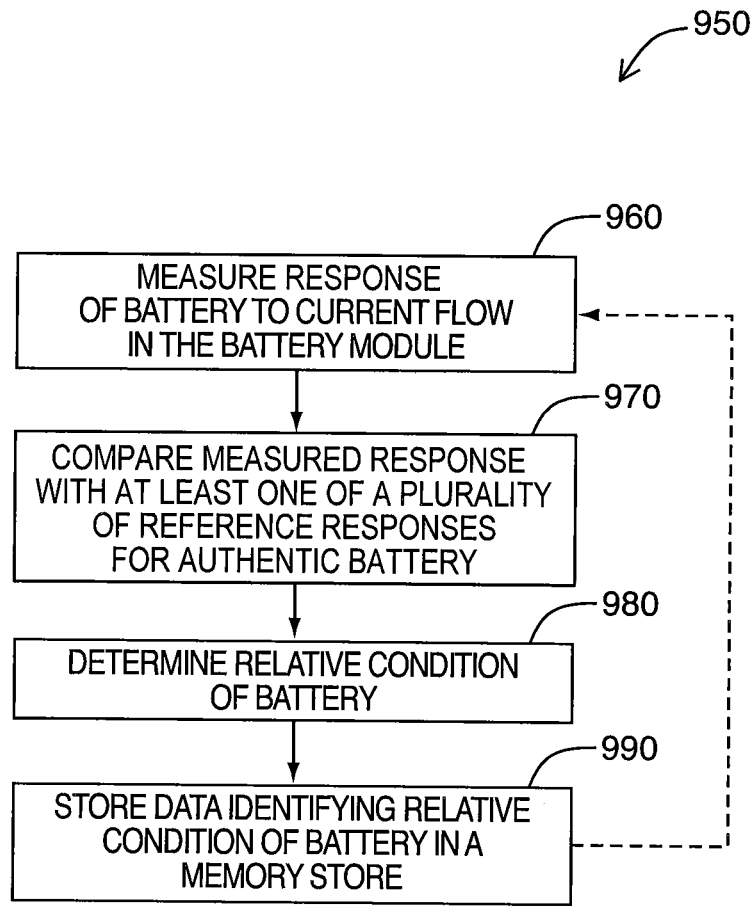
FIG. 15 is a flow chart illustrating a method of determining an estimate of the relative condition of a battery in accordance with at least one embodiment.

In variant embodiments, multiple estimates of the relative condition of the battery 130 may also be determined by comparing one or more different types of electrical or electromagnetic responses in accordance with any of the embodiments described herein, and then repeating the determination multiple times over some time period. In one aspect, data identifying the relative condition of the battery 130, and optionally other data obtainable when determining the relative condition (e.g. generated curve or model data, the date or time when a given estimate of the relative condition was taken, etc.), can be logged by storing the data in a memory store. FIG. 15 illustrates one example of a method of determining an estimate of the relative condition of a battery in accordance with at least one embodiment, with acts 960 and 970 being generally analogous to acts 910 and 915 of FIG. 14 respectively. Accordingly, a history of determined estimates of the relative condition of the battery 130 may be maintained. The mobile device 100 (e.g. power management module 134) may be configured to log the data by storing the data on the mobile device 100. The data may be additionally or alternatively stored on the battery 130 (e.g. battery memory 254). Data may be partially stored on the mobile device 100, and partially stored on the battery 130. In variant implementations, the battery 130 (e.g. battery processor 252 or other module or circuitry) may be configured to log the data by storing the data on the battery 130.

By providing logging functionality in combination with the features of the embodiments described herein, continuous monitoring of the battery 130 may be more effectively implemented. This may enhance safety of battery use, or provide advance notice of a defective battery, for example. For instance, if a series of estimates of the relative condition of the battery 130 is taken over a period of time, the rate of change in the degradation of the state of health of the battery may be determined. If the rate of change of degradation exceeds a threshold tolerance level (e.g. the battery is suffering wear over time much more quickly than what would be typical for a "normal" battery), then this may be indicative that the battery 130 is defective or has suffered damage. In one aspect, similar to the warranty prediction functionality described previously, a corresponding data message, signal or other indicator may be automatically transmitted by the mobile device 100 to, for example, the manufacturer of the mobile device 100 or battery 130, to provide notice of this defect. If many batteries are experiencing the same condition, this may provide the manufacturer with advanced notice, allowing the manufacturer to plan accordingly (e.g. prepare to deal with a recall or mass return of battery stock).

Moreover, data that has been logged when determining the relative condition in a given instance may also be used in a subsequent instance for more efficient processing. For example, if generated curve or model data has been previously stored for the battery 130, some of this data may then be re-used to more quickly generate curves or other data when determining the current estimate of the relative condition of battery 130 (or to authenticate the battery 130, or both).

The graphs depicted herein are provided for illustrative purposes to aid in the understanding of described embodiments, and are not necessarily to scale. No representation is being made as to accuracy of the data used to produce the graphs or the processes used to measure the data.

Some example embodiments have been described herein with reference to the drawings and in terms of certain specific details to provide a thorough comprehension of the described embodiments. However, it will be understood that the embodiments described herein may be practiced in some cases without one or more of the described aspects. In some places, description of well-known methods, procedures and components has been omitted for convenience and to enhance clarity. It should also be understood that various modifications to the embodiments described and illustrated herein might be possible. The scope of the embodiments is thereby defined by the appended listing of claim.

The invention claimed is:

1. An electronic device comprising:
an interface for receiving a battery comprising a battery module for supplying power to the electronic device; and
a power management module coupled to the interface for communication with the battery, the power management module configured to:
measure an electromagnetic radiation spectrum of the battery due to current flow in the battery module;
compare the measured electromagnetic radiation spectrum of the battery to at least one of a plurality of reference electromagnetic radiation spectrums, each of the reference electromagnetic radiation spectrums corresponding with a different relative condition;
determine a relative condition of the battery by comparing the measured electromagnetic radiation spectrum with one of the plurality of reference electromagnetic radiation spectrums;
store, in a memory store, data identifying the relative condition of the battery;
repeat measuring the electromagnetic radiation spectrum, comparing the electromagnetic radiation spectrum, determining the relative condition of the battery, and storing the relative condition for a plurality of instances such that a plurality of relative conditions of the battery are determined over a period of time;
compare the plurality of relative conditions of the battery stored in the memory store;
determine a rate of change of relative condition of the battery over the period of time; and
determine if the rate of change exceeds a threshold tolerance level.

2. The device of claim 1, wherein the power management module is further configured to output an indicator of a potential defect in the battery if the rate of change is determined to exceed the threshold tolerance level.

3. The device of claim 1, further comprising the battery.

4. The device of claim 1, wherein the device comprises a mobile communication device.

5. The device of claim 1, wherein each of the reference electromagnetic radiation spectrums comprises an electromagnetic radiation spectrum of an authentic battery.

6. The device of claim 1, wherein the power management module is further configured to store additional data obtained when determining the relative condition of the battery.

7. The device of claim 6, wherein the additional data comprises an indication of when the relative condition of the battery was determined.

8. The device of claim 1, wherein the relative condition of the battery comprises at least one of an age or state of health of the battery.

9. A method for authenticating a battery for use with an electronic device, the electronic device comprising an interface for receiving the battery and a power management module coupled to the interface for communication with the battery, and the battery comprising a battery module for supplying power to the electronic device, the method comprising:
measuring, at the power management module, an electromagnetic radiation spectrum of the battery due to current flow in the battery module;
comparing, at the power management module, the measured electromagnetic radiation spectrum of the battery to at least one of a plurality of reference electromagnetic radiation spectrums, each of the reference electromagnetic radiation spectrums corresponding with a different relative condition;
determining, at the power management module, a relative condition of the battery by comparing the measured electromagnetic radiation spectrum with one of the plurality of reference electromagnetic radiation spectrums;
storing, in a memory store, data identifying the relative condition of the battery;
repeating the measuring, the comparing, the determining, and the storing for a plurality of instances such that a plurality of relative conditions of the battery are determined over a period of time;
comparing, at the power management module, the plurality of relative conditions of the battery stored in the memory store;
determining, at the power management module, a rate of change of relative condition of the battery over the period of time; and
determining, at the power management module, if the rate of change exceeds a threshold tolerance level.

10. The method of claim 9, further comprising outputting at the power management module an indicator of a potential defect in the battery if the rate of change is determined to exceed the threshold tolerance level.

11. An electronic device comprising:
an interface for receiving a battery comprising a battery module for supplying power to the electronic device; and
a power management module coupled to the interface for communication with the battery, the power management module configured to:
measure a voltage response of the battery due to current flow in the battery module;
compare the measured voltage response of the battery to at least one of a plurality of reference voltage responses, each of the reference voltage responses corresponding with a different relative condition;
determine a relative condition of the battery by comparing the measured voltage response with one of the plurality of reference voltage responses;
store, in a memory store, data identifying the relative condition of the battery;

repeat measuring the voltage response, comparing the voltage response, determining the relative condition of the battery, and storing the relative condition for a plurality of instances such that a plurality of relative conditions of the battery are determined over a period of time;

compare the plurality of relative conditions of the battery stored in the memory store;

determine a rate of change of relative condition of the battery over the period of time; and determine if the rate of change exceeds a threshold tolerance level.

12. The device of claim 11, wherein the power management module is further configured to output an indicator of a potential defect in the battery if the rate of change is determined to exceed the threshold tolerance level.

13. The device of claim 11, further comprising the battery.

14. The device of claim 11, wherein the device comprises a mobile communication device.

15. The device of claim 11, wherein each of the reference voltage responses comprises a voltage response of an authentic battery.

16. The device of claim 11, wherein the power management module is further configured to store additional data obtained when determining the relative condition of the battery.

17. The device of claim 16, wherein the additional data comprises an indication of when the relative condition of the battery was determined.

18. The device of claim 11, wherein the relative condition of the battery comprises at least one of an age or state of health of the battery.

19. A method for authenticating a battery for use with an electronic device, the electronic device comprising an interface for receiving the battery and a power management module coupled to the interface for communication with the battery, and the battery comprising a battery module for supplying power to the electronic device, the method comprising:

measuring, at the power management module, a voltage response of the battery due to current flow in the battery module;

comparing, at the power management module, the measured voltage response of the battery to at least one of a plurality of reference voltage responses, each of the reference voltage responses corresponding with a different relative condition;

determining, at the power management module, a relative condition of the battery by comparing the measured voltage response with one of the plurality of reference voltage responses;

storing, in a memory store, data identifying the relative condition of the battery;

repeating the measuring, the comparing, the determining, and the storing for a plurality of instances such that a plurality of relative conditions of the battery are determined over a period of time;

comparing, at the power management module, the plurality of relative conditions of the battery stored in the memory store;

determining, at the power management module, a rate of change of relative condition of the battery over the period of time; and determining, at the power management module, if the rate of change exceeds a threshold tolerance level.

20. The method of claim 19, further comprising outputting at the power management module an indicator of a potential defect in the battery if the rate of change is determined to exceed the threshold.

* * * * *